United States Patent [19]

Hayosh

[11] Patent Number: 5,712,564
[45] Date of Patent: Jan. 27, 1998

[54] MAGNETIC INK RECORDER CALIBRATION APPARATUS AND METHOD

[75] Inventor: Thomas D. Hayosh, Bloomfield Hills, Mich.

[73] Assignee: Unisys Corporation, Blue Bell, Pa.

[21] Appl. No.: 581,085

[22] Filed: Dec. 29, 1995

[51] Int. Cl.$^6$ .......................... G01R 33/12; G01R 35/00; G01N 27/72
[52] U.S. Cl. .................. 324/210; 324/202; 324/226; 324/260
[58] Field of Search .................. 324/200, 201, 324/202, 204, 210–213, 222, 223, 225–228, 232–243, 260–263

[56] References Cited

U.S. PATENT DOCUMENTS

| | | | |
|---|---|---|---|
| 3,638,238 | 1/1972 | Milford et al. | 382/208 |
| 3,778,598 | 12/1973 | Eberly, Jr. et al. | 324/239 X |
| 3,966,047 | 6/1976 | Steiner | 324/226 X |
| 4,107,653 | 8/1978 | Kruklitis | 235/449 X |
| 4,143,355 | 3/1979 | MacIntyre | 235/449 X |
| 4,245,211 | 1/1981 | Kao . | |
| 4,372,672 | 2/1983 | Pries | 355/14 R |
| 4,458,143 | 7/1984 | Gitlis | 324/260 X |
| 4,563,086 | 1/1986 | Knapp et al. | 355/140 |
| 4,584,529 | 4/1986 | Aoyema | 324/226 X |
| 4,734,643 | 3/1988 | Bubenik et al. | 324/226 X |
| 4,749,087 | 6/1988 | Buttifant | 324/232 X |
| 4,764,725 | 8/1988 | Bryce | 324/228 X |
| 4,797,938 | 1/1989 | Will | 382/7 |
| 5,054,092 | 10/1991 | LaCaze | 382/11 |
| 5,140,368 | 8/1992 | Szlucha | 355/202 |
| 5,278,500 | 1/1994 | Seitz | 324/239 X |
| 5,341,193 | 8/1994 | Hubble et al. | 355/203 |
| 5,418,458 | 5/1995 | Jeffers | 324/235 |
| 5,488,293 | 1/1996 | Ross | 324/202 |
| 5,512,822 | 4/1996 | Masuda | 324/228 X |

*Primary Examiner*—Thomas P. Noland
*Attorney, Agent, or Firm*—Charles A. Johnson; Mark T. Starr

[57] ABSTRACT

A low-cost, portable, magnetic ink printer calibration system including a device which directly measures magnetic flux from recorded magnetic ink characters and provides an electrical signal representative of that flux, an amplifier to convert the electrical signal into a readable signal level, and a device to provide a measure of that signal level so that the signal can be compared to one produced by a reference character and the comparison results used for printer calibration.

26 Claims, 21 Drawing Sheets

USING READ HEAD CALIBRATION SYSTEM TO CALIBRATE MICR PRINTER

| NAME | E-13B MICR CHARACTER |
|---|---|
| ONE (1) | 1 |
| TWO (2) | 2 |
| THREE (3) | 3 |
| FOUR (4) | 4 |
| FIVE (5) | 5 |
| SIX (6) | 6 |
| SEVEN (7) | 7 |
| EIGHT (8) | 8 |
| NINE (9) | 9 |
| ZERO (0) | 0 |
| TRANSIT SYMBOL | ⑆ |
| AMOUNT SYMBOL | ⑈ |
| ON-US SYMBOL | ⑇ |
| DASH SYMBOL | — |

*Figure 1*

PROCESS USED TO GENERATE MAGNETIC INK CHARACTERS

CALIBRATION PROCEDURE FOR MICR
PRINTER CALIBRATION SYSTEM

| MICR CHARACTER NAME | REFERENCE PEAK NUMBER | NOMINAL FLUX SIGNAL LEVEL (ARBITRARY SIGNAL UNITS) | NOMINAL VOLTAGE (READ HEAD CALIBRATED SO 100 FLUX UNITS = 1 VOLT) | -50% OF NOMINAL VOLTAGE | +100% OF NOMINAL VOLTAGE |
|---|---|---|---|---|---|
| | | 3 | 4 | 5 | 6 |
| 1 | 2 | 142 | 1.42 VOLTS | 0.71 VOLTS | 2.84 VOLTS |
| 1 | 2 | 100 | 1.00 VOLTS | 0.50 VOLTS | 2.00 VOLTS |
| 2 | 1 | 157 | 1.57 VOLTS | 0.785 VOLTS | 3.14 VOLTS |
| 3 | 1 | 115 | 1.15 VOLTS | 0.575 VOLTS | 2.30 VOLTS |
| 4 | 2 | 100 | 1.00 VOLTS | 0.50 VOLTS | 2.00 VOLTS |
| 5 | 1 | 147 | 1.47 VOLTS | 0.735 VOLTS | 2.94 VOLTS |
| 6 | 3 | 71 | 0.71 VOLTS | 0.355 VOLTS | 1.42 VOLTS |
| 7 | 1 | 150 | 1.50 VOLTS | 0.75 VOLTS | 3.00 VOLTS |
| 8 | 2 | 154 | 1.54 VOLTS | 0.77 VOLTS | 3.08 VOLTS |
| 9 | 1 | 133 | 1.33 VOLTS | 0.665 VOLTS | 2.66 VOLTS |
| 0 | 2 | 105 | 1.05 VOLTS | 0.525 VOLTS | 2.10 VOLTS |
| TRANSIT | AVERAGE OF 1 & 3 | 70 | 0.70 VOLTS | 0.35 VOLTS | 1.40 VOLTS |
| AMOUNT | AVERAGE OF 2 & 3 | 100 | 1.00 VOLTS | 0.50 VOLTS | 2.00 VOLTS |
| ON-US | AVERAGE OF 2 & 3 | 67 | 0.67 VOLTS | 0.335 VOLTS | 1.34 VOLTS |
| DASH | | | | | |

FLUX-TO-OUTPUT VOLTAGE CONVERSION TABLE
FOR MICR PRINTER CALIBRATION SYSTEM

*Figure 26*

MAGNETIC INK RECORDER CALIBRATION APPARATUS AND METHOD

BACKGROUND OF THE INVENTION

1. Field of the Invention

This invention relates to a method and apparatus for monitoring and calibrating the printing of magnetic ink characters; and, more particularly, to a low-cost hand-operable direct magnetic flux reading system capable of providing an electrical signal representative of the magnetic flux produced by magnetic ink characters.

2. Description of the Prior Art

The E-13B Magnetic Ink Character Recognition (MICR) font, or character set, which is defined in the American National Standard (ANS) 9.27-1995, is a standard set of ten numerals and four special symbols printed in magnetic ink. This character set can be read by certain magnetic ink character recognition systems, and is commonly used to imprint information on checks and other financial documents to facilitate automated processing. Every day, millions of transactions are performed using systems able to read and process MICR characters.

Today, MICR characters are often printed by high speed electrophotographic printing machines that transfer magnetizable toner particles onto the target document using a predetermined font such as the E13-B. The magnetic particles in the ink are then magnetized using a system such as that disclosed in Kruklitis, U.S. Pat. No. 4,107,653. In the Kruklitis system, the target document is transported past two magnets, one on either side of the transport path. The magnetic field set up by this system orientates the dipoles of the magnetic particles of the document so that all magnetic vectors lie in the same direction. The resulting vectors lie in the plane of the document with a predetermined edge such as the right edge of each character being a north pole.

The process of applying the magnetizable ink particles to the paper must be closely monitored, since the particles must be applied in the correct density and distribution for the resulting MICR characters to be readable by a MICR recognition system. Some printers contain closed loop control systems which monitor the magnetic flux of newly printed characters so that printer parameters can be automatically adjusted to keep the print within specification. Knapp, et al., U.S. Pat. No. 4,563,086, is a printing system employing a MICR read head positioned to sense the change of magnetic flux over time (d$\phi$/dt) as the document is transferred past the read head. Output of the read head is converted to a control signal for regulating the printing mechanism. Hubble, III et al., U.S. Pat. No. 5,341,193, discloses a printing system which is similar to Knapp. A read head is positioned to detect the magnetic line width and the change of magnetic flux over time as the leading and trailing edges of magnetized characters pass the read head at a uniform velocity. These measurements are used to generate control signals which control the magnetic quality of the printed characters. Such systems are complex, expensive, and difficult to maintain.

Some printers used to generate MICR text employ control mechanisms which depend on print characteristics other than magnetic flux. U.S. Pat. No. 4,372,672 uses the light rays reflected from a printed character to adjust toner concentration and maintain a constant copy density. Since ink density is nearly proportional to the number of magnetic particles contained in a printer stroke, this measurement can be used to roughly control MICR copy quality. Such detectors may lose sensitivity at high ink densities, however.

Users employing such printing systems must therefore rely on external MICR readers for calibration purposes.

Most external MICR readers are complex and expensive. Of the various MICR read systems, many employ a transducer which is passed over a printed character at a constant velocity to produce an electrical signal proportional to the time rate of change of magnetic flux, d$\phi$/dt. Character recognition or printer calibration can be performed by comparing the d$\phi$/dt waveform to reference waveforms. The ANS 9.27 specification contains d$\phi$/dt reference waveforms for all characters in the E-13B character set.

Milford et al., U.S. Pat. No. 3,638,238 uses d$\phi$/dt waveforms to recognize MICR characters. Mechanized rollers guide documents past a transducer to obtain the constant speed. Szlucha, U.S. Pat. No. 5,140,368, discloses a quality control system similar to Milford. A transport means guides the document past the read head so an accurate d$\phi$/dt waveform is obtained. As illustrated by Milford and Szlucha, systems requiring constant velocity read heads are generally complex and expensive.

Other systems recognize the problem of maintaining a constant read head velocity, and have developed mechanisms to relax this requirement. MacIntyre, U.S. Pat. No. 4,143,355 teaches a read head which obtains its system clock from a mechanical clock pulse encoder moving in synchronism with the relative movement of the read head. Since the clock rate varies with the read head velocity, d$\phi$/dt calculation can be performed despite variations in read head speed so long as the read head is kept moving. LaCaze, U.S. Pat. No. 5,054,092, employs the MacIntyre mechanical clock pulse encoder in a portable read head system. A document edge is manually conveyed through a defined slotted path. The document frictionally engages an idler member which generates a clock so that the document speed can be computed accurately to determine the d$\phi$/dt.

MICR reading systems which generate the system clock using relative read head velocity permit relaxation of the constant velocity requirement. These systems do, however, require constant frictional engagement with the document. A torn or creased document may cause the mechanical engagement to slip. Moreover, the frictional engagement can cause components to wear over time, resulting in inaccurate readings.

Another method of compensating for speed variations involves adjusting system timing based on the distance between the peaks in the d$\phi$/dt waveforms of previously scanned characters. U.S. Pat. No. 4,245,211 uses a phase locked loop to accomplish this kind of adjustment. Since these timing adjustments are based on past history, they do not compensate for isolated speed variations, and can result in inaccurate waveform calculations.

Will, U.S. Pat. No. 4,797,938, seeks to solve the constant velocity problem by digitizing samples of a character waveform, then comparing the relative position of peaks and valleys to those of template waveforms. The timing for the character is determined by reference to the entire character, thus compensating for random variations in read head speed. This system is both complex and expensive.

Today, MICR characters are printed on over 80 billion checks annually world-wide. The printing process used to produce these documents must be closely monitored to ensure that the information can be read by MICR readers. Some printers do not contain adequate self-monitoring systems, and thus external MICR read systems must be used for this purpose. However, most MICR read systems are complex and expensive. All utilize a variation on systems requiring document or head movement relative to each other to allow reading of dφ/dt, with all of the inherent problems of speed control, synchronization, and attendant intricacies related thereto.

OBJECTS

It is an object of this invention to provide an improved calibration system for magnetic ink printers.

It is another object of this invention to provide an improved method for calibrating magnetic ink printers.

Yet another object of this invention is to provide a simplified system for use in calibrating magnetic ink printers that does not require the intricacies of systems that measure change of magnetic flux over time resulting from relative movement of a read head and the document.

It is yet another object of this invention to provide a method for calibrating magnetic ink printers using direct flux measurements.

It is still another object of this invention to provide apparatus for directly measuring the flux of a symbol printed in magnetizable ink.

It is another object of this invention to provide a portable printer calibration system for magnetic ink printers.

It is yet another object of this invention to provide a hand-operable printer calibration system for magnetic ink printers.

It is a further object of this invention to provide a low-cost printer calibration system for magnetic ink printers.

Still a further object of this invention is to provide a printer calibration system which is immune to variations in the document scan velocity.

Still another object of this invention is to provide a simple, easily maintainable calibration system for symbols printed in magnetizable ink.

Other more detailed objectives will become apparent from a consideration of the Drawings and the Detailed Description of the Preferred Embodiment.

SUMMARY OF THE INVENTION

The portable low-cost magnetic ink symbol recognition system provides an inexpensive and compact means for calibrating magnetic ink printers. The read head consists primarily of two magnetic pole pieces. At the base of the read head, the pole pieces are held apart from one another but in close proximity by a spacer formed of non-ferromagnetic material. This small separation is referred to as the "front gap". The pole pieces are spaced from each other at the top of the read head using a spacer of non-ferromagnetic material to form the "back gap". As the base of the read head is placed over a MICR character, the magnetic flux existing under the front gap is captured by the pole pieces and concentrated at the back gap. A magnetic flux sensor positioned in the back gap directly measures the magnetic flux and generates an electrical signal which is directly proportional to the magnetic flux flowing through the pole pieces. The electrical signal produced by the magnetic sensor is amplified to a level which can be read by a simple metering device such as a voltmeter.

After using a reference character to calibrate the read head amplifier, the magnetic ink recorder calibration system is used to calibrate magnetic ink character recorders. The system is used in conjunction with a sample document containing MICR characters. The sample MICR characters are generated by a magnetic ink character recorder which deposits magnetizable ink on the document. The characters are then pre-magnetized using magnets assuring both saturation and a magnetic vector lying within the plane of the paper. As the read head is positioned over any given point on one of the sample characters, the magnetic flux from the magnetized particles located under the read head front gap spacer is captured by the pole pieces, measured by the magnetic flux sensor, converted to an electrical signal, and amplified to a readable signal level. By successively re-positioning the read head at various locations across a sample character, the user can locate one or more local maximum magnetic flux measurements. The locations yielding these maximum flux readings are called calibration locations. By comparing the flux measurements (as represented by the electrical signals) obtained at the calibration locations to those measurements obtained from a like character printed at 100% of nominal, the user can determine if the sample character is printed within a predetermined tolerance range of the 100% nominal signal level. If the magnetic flux of the sample character is outside of the tolerance range, the device which recorded the sample character must be adjusted.

Unlike other flux read heads which measure the change of flux over time, dφ/dt, the present invention measures magnetic flux directly. This allows for a very low-cost hand-operable system that can perform calibration accurately regardless of the speed variations which occur during the document scanning process. Moreover, since the system does not require frictional engagement with the scanned document, components are not subjected to wear, and creased or torn documents can be easily scanned.

BRIEF DESCRIPTION OF THE DRAWINGS

FIG. 1 is a chart illustrating the E-13B magnetic ink character set.

FIG. 26 is a table listing acceptable ranges for voltage readings obtained using a properly calibrated embodiment of the current invention positioned over the proper calibration locations for the respective E13-B characters.

DETAILED DESCRIPTION OF THE PREFERRED EMBODIMENT

FIG. 1 is a chart illustrating the E-13B character set. The E-13B Magnetic Ink Character Recognition (MICR) font, which is defined in the American National Standard (ANS) 9.27-1995. This standard set of ten numerals and four special symbols is printed in magnetic ink. After the symbols are magnetized, they can be read by certain magnetic ink character recognition systems. This font is commonly used to imprint information on checks and other financial documents to facilitate automated processing.

Figure 2:
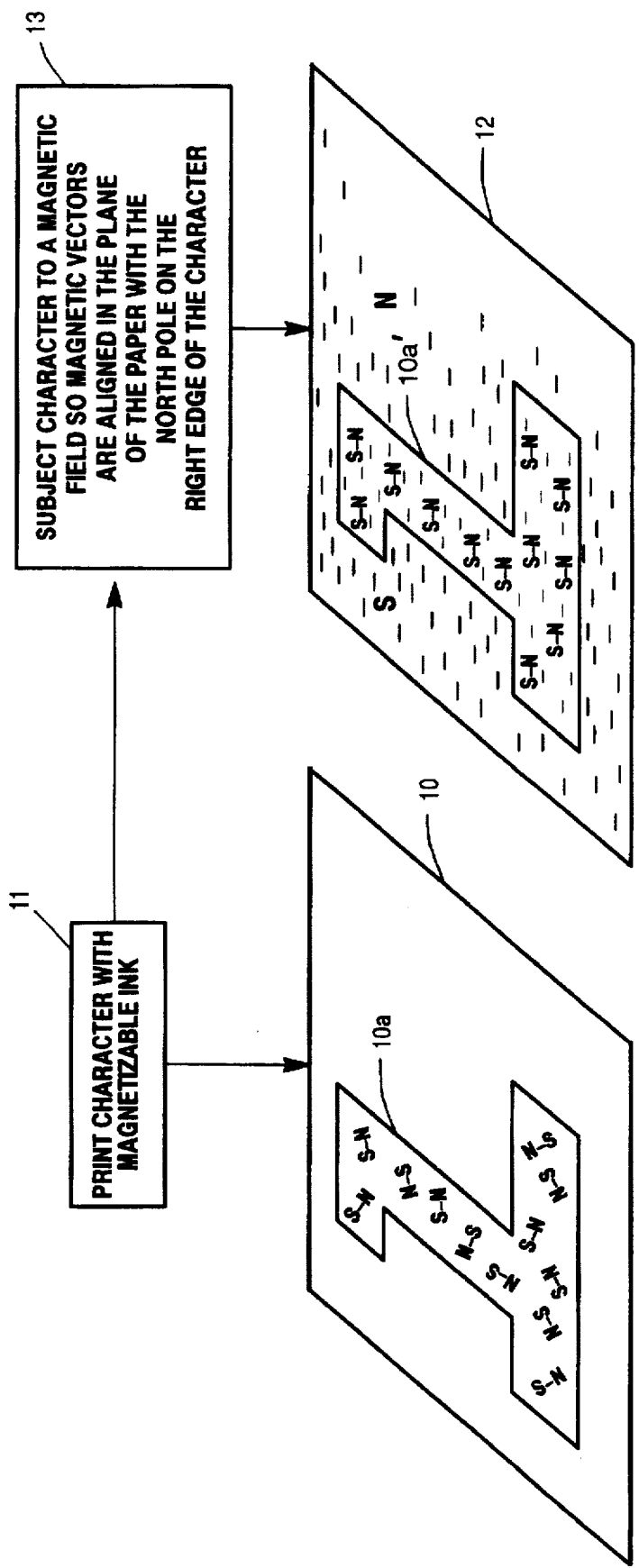
FIG. 2 is a diagram showing the process used to generate magnetic ink characters.

FIG. 2 is a diagram showing the process used to generate magnetic ink characters. As shown in block 10, an example character 10a is typically printed in magnetizable ink with a high-speed electrophotographic printing machine represented by block 11. The magnetic particles (N-S) in the ink are randomly positioned when first deposited. These particles are then magnetized as shown in block 12 using a system such as that disclosed in Kruklitis, U.S. Pat. No. 4,107,653, represented by block 13, where the character is subjected to a magnetic field. The target document is transported through a magnetic field so that the dipoles of the magnetic particles (N-S) for character 10a' are orientated in the same direction. The standard for the E13-B font specifies that the resulting vector must lie in the plane of the document orientated so that the right edge of each character is a north pole.

Figure 3:
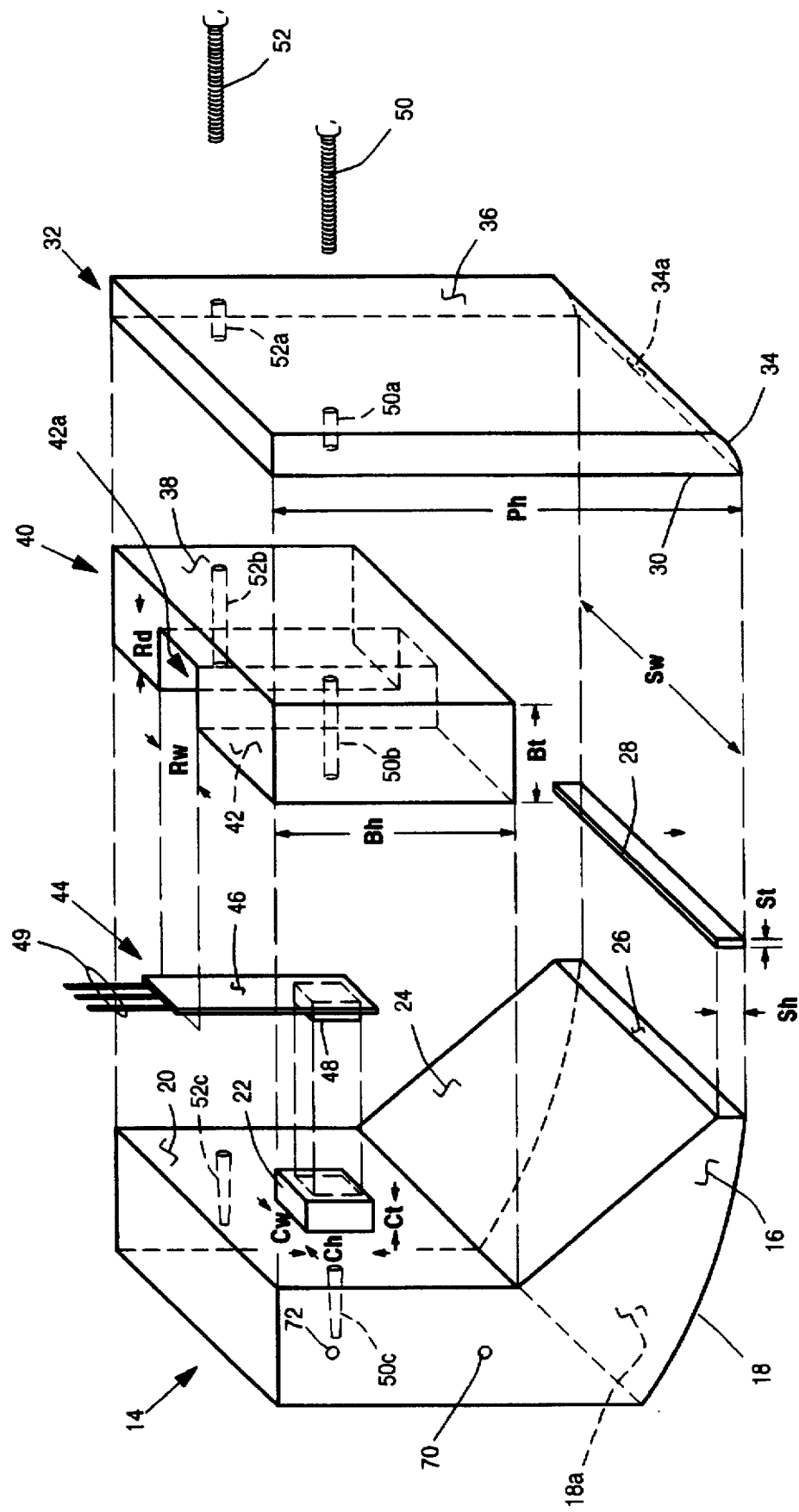
FIG. 3 is an exploded perspective view of a read head detached from a slider assembly.

FIG. 3 is an exploded perspective view of a read head detached from a slider assembly. Pole piece one 14 has a first vertical mating surface 16 to mount to a slider as will be described below, and has a height "Ph" of about 0.600 inch.

First mating surface 16 has an arcuate base edge 18 and bottom contact surface 18a with a radius of about 0.750 inch. A vertical trailing surface 20 is perpendicular to surface 16. A mating contact 22 juts normally from trailing surface 20. The mating contact has a width "Cw" of about 0.150 inch, a height "Ch" of about 0.150 inch, and a thickness "Ct" of about 0.059 inch. A surface 24 slants from vertical surface 20 to a second vertical mating surface 26. The second vertical mating surface 26 has a height "Sh" of about 0.200 inch, and a width "Sw" of about 0.625 inch.

Second mating surface 26 mates with a "front gap" spacer 28 formed of a non-magnetic material such a phosphor bronze or hard brass. This front gap spacer has a height "Sh" of about 0.200 inch, a width "Sw" of about 0.625 inch, and a thickness "St" of about 0.003 inch. The front gap spacer further mates with the vertical mating surface 30 of pole piece two 32. Pole piece two 32 has an arcuate base edge 34 and a bottom contact surface 34a with a radius of about 0.750 inch. Pole piece two further has a height "Ph" of about 0.600 inch and a vertical trailing edge 36.

Both pole piece one 14 and pole piece two 32 are formed of a material having a high magnetic permeability and a low coercive force, such as Hy-μu 80, or Moly Permalloy, both of which are alloys available from the Carpenter Steal Company.

The vertical surface 30 of pole piece two 32 further mates with a first vertical mating surface 38 of back gap spacer 40. Back gap spacer 40 is formed of a non-magnetic material such as phosphor bronze or hard brass, and has a height "Bh" of about 0.300 inch, and thickness "Bt" of about 0.203 inch. A second vertical mating surface 42 has a vertical receiving channel 42a with a width "Rw" of about 0.160 inch and a depth "Rd" of about 0.063 inch. The vertical receiving channel 42a mates with a typical Hall-Effect device 44 such as the microswitch number SS94A1 available commercially from Honeywell, Inc. It is understood that any device which directly measures flux, including devices employing Giant Magnetoresistive Ratio materials such as Nonvolatile Electronics, Inc. part number NVS5HB50B, could be utilized. Mating surface 46 of the Hall-Effect device is held to the bottom of the receiving channel 42a with any commercially available adhesive. The integrated circuit chip 48 of device 44 is positioned to contact mating contact 22 of pole piece one 14.

The entire assembly is fastened together with first fastener 50 and second fastener 52, which in the preferred embodiment are screws. First fastener 50 is inserted through receptacle 50a in pole piece two 32, through receptacle 50b in back gap spacer 40, and through tapped screw hole 50c in pole piece one 14. Second fastener 52 is inserted through receptacle 52a in pole piece two 32, through receptacle 52b in back gap spacer 40, and through tapped screw hole 52c in pole piece one 14. The front gap spacer 28 is held in place by the inward force of fastened pole piece one 14 and pole piece two 32 when drawn together by fastener 50 and fastener 52.

Together pole piece one 14 and pole piece two 32 form a magnetic circuit. As the read head is placed over magnetized characters, the magnetic flux lines from the characters are captured and concentrated by the pole pieces. Flux lines flow through the mating contact 22 and are measured by the flux measurement device 44, which in turn provides electrical signals on wires 49.

FIG. 3 depicts a read head profile which conforms to that described in ANS 9.27-1995. Namely, the arcuate contact surface formed by surfaces 18a and 34a has a radius of about 0.750 inch. The gap width "Sw" is a minimum of 0.625 inch, and the front gap spacer thickness, "St", is about 0.003 inch. Surfaces 26, 30, and 20 are perpendicular to the plane of the printed characters within±0.2°. Although the read head of FIG. 3 was designed to comply with ANS 9.27, it is susceptible to various modification and embodiments without the exercise of further inventive activity.

Figure 4:
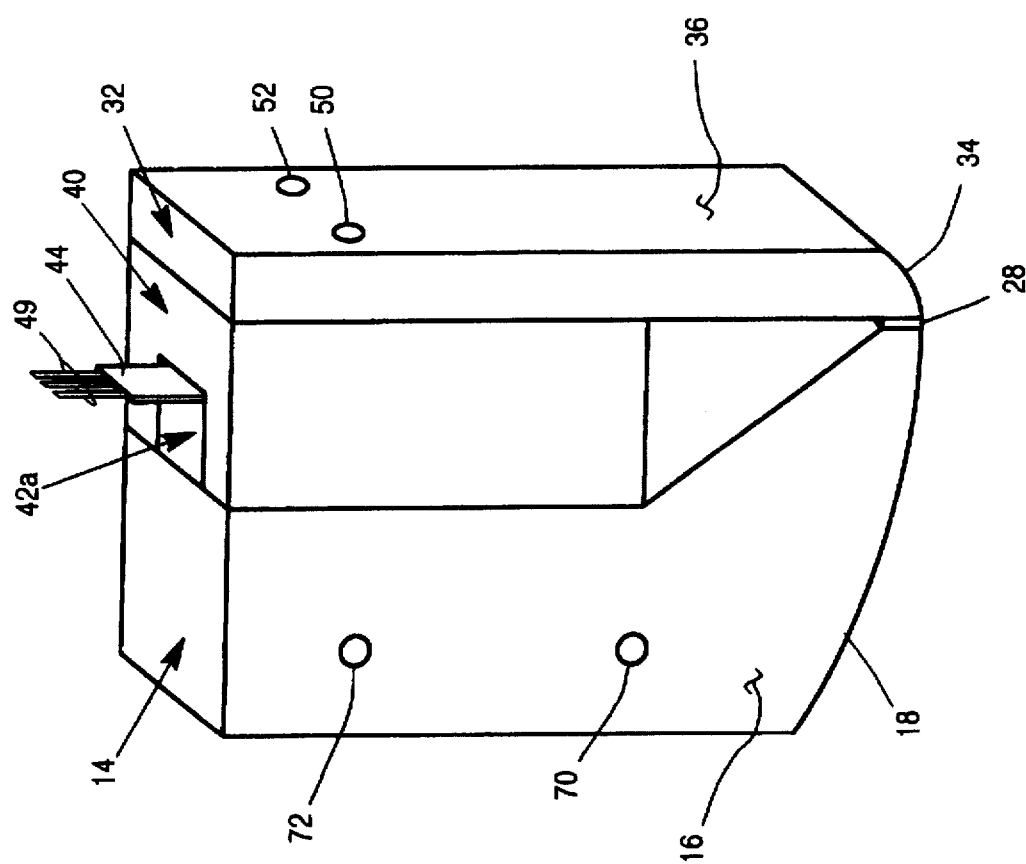
FIG. 4 is a perspective view of a read head detached from a slider assembly.

FIG. 4 is a perspective view of a read head detached from a slider assembly, and shows pole piece 14 and pole piece 32 engaging front gap spacer 28 and back gap spacer 40.

Figure 5:
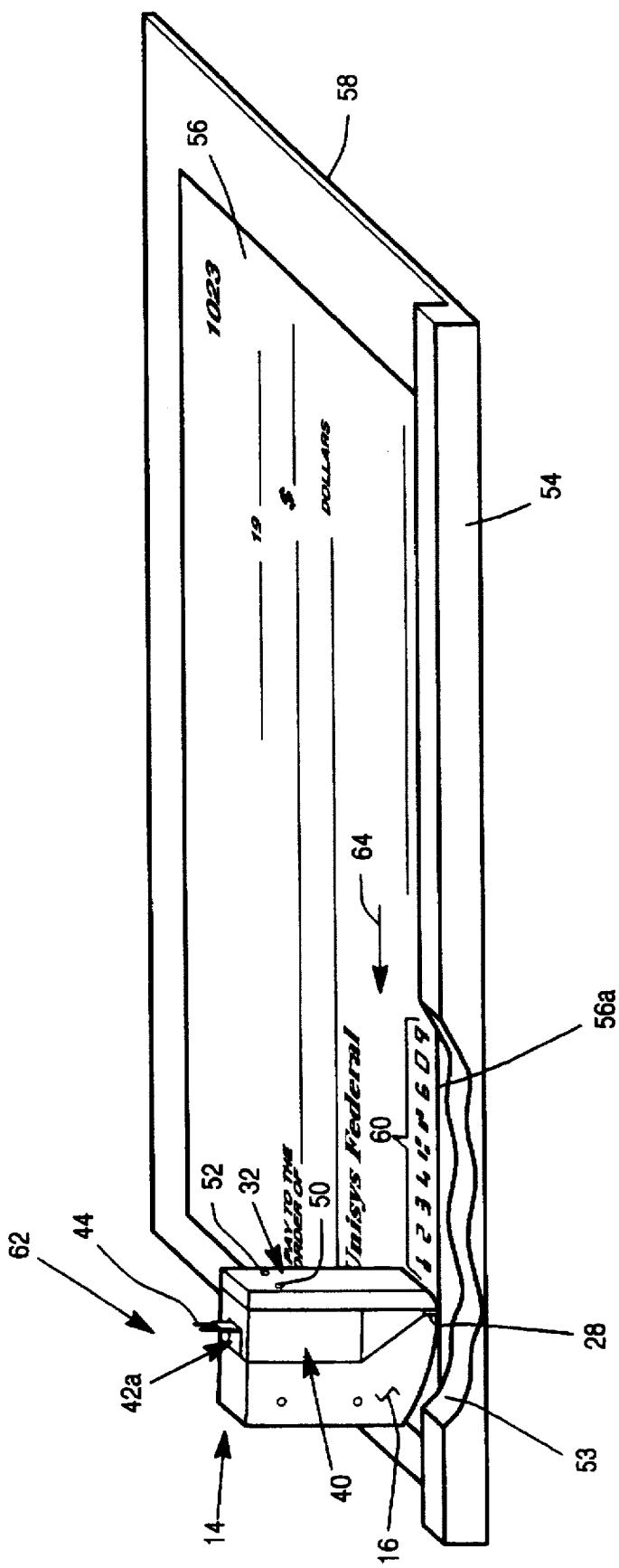
FIG. 5 is a perspective view illustrating a cut-away base plate lip exposing a check lying under an assembled read head which has been detached from the slider mechanism and positioned to sense a magnetized character.

FIG. 5 is a perspective view illustrating a cut-away portion 53 of base plate lip 54 exposing a check 56 supported on base plate 58 imprinted with magnetic characters 60 and lying under an assembled read head 62. For this view, read head 62 has been detached from the slider mechanism (to be described below) and positioned to sense one of the magnetized characters 60. The base plate 58 has a raised lip 54 on one lengthwise edge. The check 56 is lying on base plate 58 and positioned so the document edge 56a nearest the magnetized characters 60 is aligned against the base plate lip 54. When the read head 62 of the current embodiment is used to measure the magnetic signal level of one of the characters 60, it is moved in a right-to-left direction across a character as shown by arrow 64.

Figure 6:
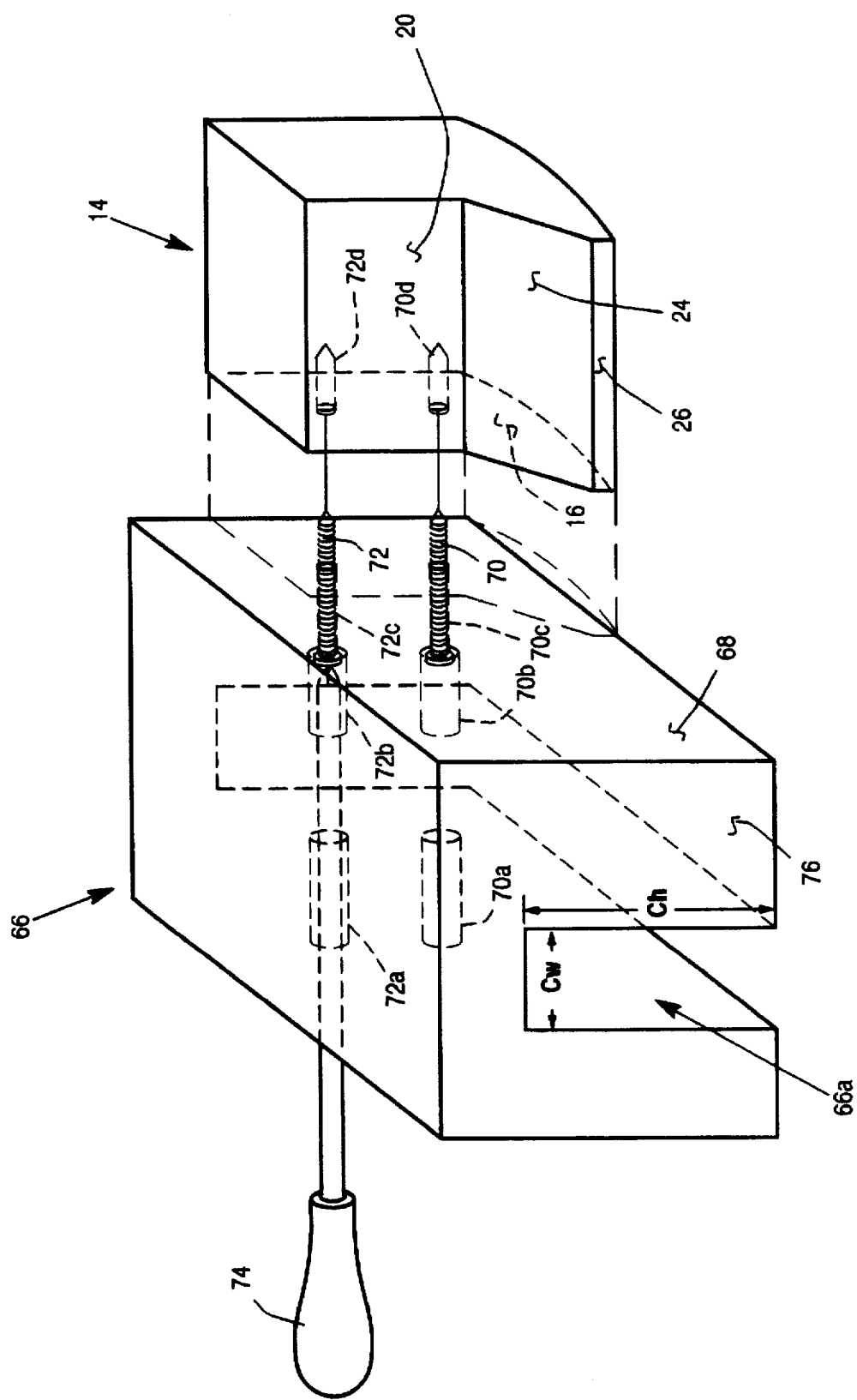
FIG. 6 is an exploded perspective view of a slider assembly as it mounts to pole piece one of a read head.

FIG. 6 is an exploded perspective view of a slider assembly 66 as it mounts to pole piece one 14 of a read head 62. The slider assembly 66 has a first mating surface 68 which mates with the first mating surface 16 of pole piece one 14. The slider assembly 66 is attached to pole piece one 14 with fastener 70 and fastener 72, which in this embodiment are screws. Fastener 70 is inserted through apertures 70a and 70b into receptacle 70c and into tapped screw hole 79d using insertion tool 74. Likewise, fastener 72 is inserted through apertures 72a and 72b into receptacle 72c and into tapped screw hole 72d using insertion tool 74. Slider assembly 66 further has a longitudinal slider channel 66a for slidably engaging base plate lip 54. Slider channel 66a has a height "Ch" of about 0.380 inch, and a width "Cw" of about 0.130 inch. Finally, slider assembly 66 has a vertical trailing surface 76

Figure 7:
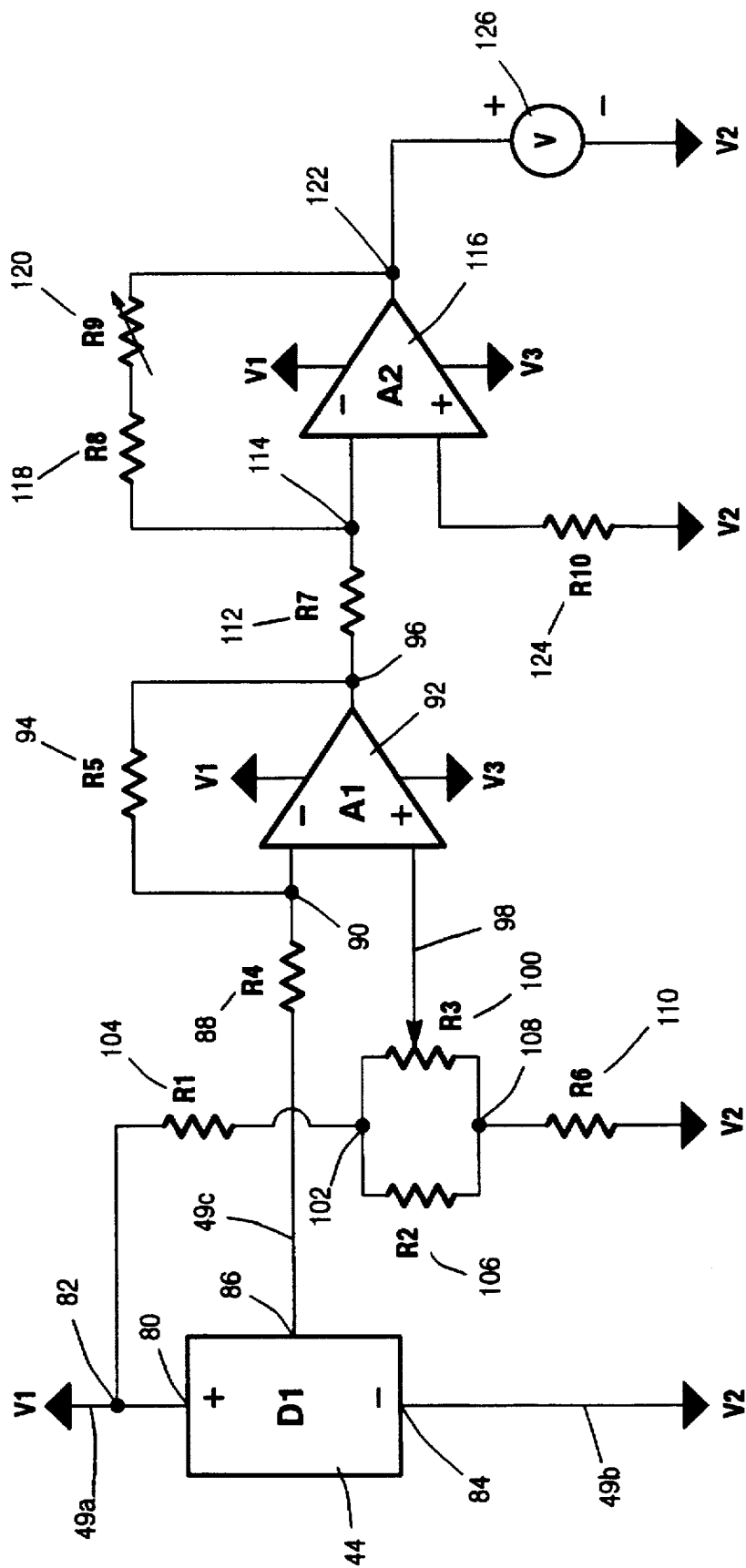
FIG. 7 is a schematic diagram of an amplifier circuit used to convert the flux measurement to a readable electrical signal.

FIG. 7 is a schematic diagram of an amplifier circuit used to convert the magnetic flux measurement to a readable electrical signal. The positive terminal 80 of a direct flux measurement device 44 is connected via line 49a to a voltage V1 at circuit node 82. The negative terminal 84 of direct flux measurement device 44 is connected via line 49b to voltage V2, and the output terminal 86 of direct flux measurement device 44 is connected via line 49c to a first terminal of resistor R4 88. The second terminal of a resistor R4 88 is connected to circuit node 90. Node 90 is connected to the negative (−) input terminal of an operational amplifier A1 92. Node 90 is further connected to the first terminal of a resistor R5 94. The second terminal of resistor R5 94 is connected to node 96. Node 96 is further connected to the amplifier A1 92 output terminal. The positive (+) input terminal of operational amplifier A1 92 is connected to the variable contact 98 of a potentiometer R3 100. The first terminal of potentiometer R3 100 is connected to node 102. Node 102 is further connected to a first terminal of a resistor R1 104. A second terminal of resistor R1 104 is connected to voltage V1 at node 82. Node 102 is further connected to a first terminal of a resistor R2 106. The second terminal of resistor R2 106 is connected to node 108. Node 108 is further connected to a first terminal of a resistor R6 110. The second terminal of resistor R6 110 is connected to voltage V2. The second terminal of a potentiometer R3 100 is connector to node 108. The above-described variable voltage divider formed of resistor R1 104in series with the parallel combination of potentiometer R3 100 and resistor R2 106, and further in series with resistor R6 110, is used to initialize the amplifier output voltage to a base reference voltage when the MICR calibration system is experiencing only the magnetic field of the earth.

Node 96, which is connected to the output terminal of operational amplifier 92, is further connected to a first terminal of resistor R7 112. The second terminal of resistor R7 112 is connected to node 114. Node 114 is connected to the negative (−) input terminal of operational amplifier A2 116. Node 114 is further connected to a first terminal of a resistor R8 118. The second terminal of resistor R8 118 is connected to a first terminal of potentiometer R9 120. The second terminal of potentiometer R9 120 is connected to node 122. Node 122 is further connected to the output terminal of operational amplifier A2 116. The positive (+) input terminal of operational amplifier A2 116 is connected to a first terminal of resistor R10 124. The second terminal of resistor R10 124 is connected to voltage V2. Node 122 is further connected to the positive (+) terminal of a voltmeter V 126. The negative (−) terminal of voltmeter V 126 is connected to voltage V2.

In the preferred embodiment, V1 is about +8 volts, V2 is ground, V3 is about −5 volts, R1 and R6 are 4.7KΩ±1%, R2 is about 100 Ω, R3 is a 1K ΩQ precision potentiometer, R4 and R8 are 2.2 K Ω, R5 is one MEGΩ, R7 and R10 are 1K Ω, R9 is a 10K Ω potentiometer, A1 and A2 are Signetics NE5532 operational amplifiers, and D1 44 is a SS94A1 Honeywell Micro-Switch. In this embodiment, the amplifier has a first stage gain of about 454.5, and a second stage gain of between 2.2 and 12.2, for an overall gain of between approximately 1000 and 5545. All parts are available commercially.

Figure 8:
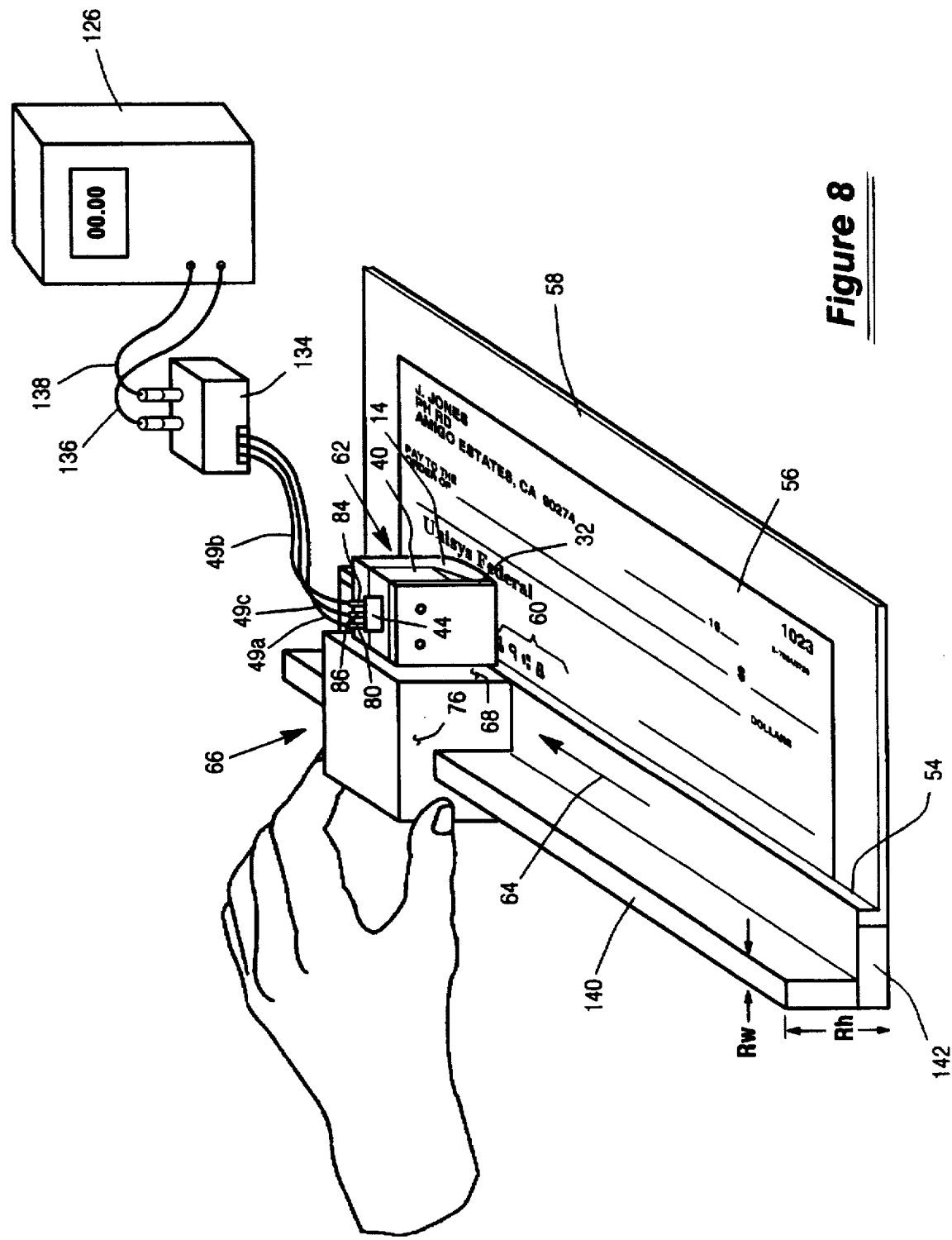
FIG. 8 is a perspective view showing the read head mounted to a slider assembly, with the terminals of the read head flux measurement device connected to the read head amplifier.

FIG. 8 is a perspective view that shows terminals of a typical Hall Effect device 44 connected to the amplifier circuit of FIG. 7, and a read head 62 mounted to a slider assembly 66. Three conductive leads 49a, 49c, and 49b connect the positive terminal 80, the output terminal 86, and the negative terminal 84, respectively, of the Hall Effect device 44 to the amplifier circuit of FIG. 7. The amplifier circuit is shown housed in a protective case 134. Lead 136 connects the positive (+) terminal of voltmeter V 126 to node 122 of the amplifier, thereby allowing the voltmeter to measure amplifier output voltage. Lead 138 connects the negative (−) terminal of the voltmeter 126 to voltage V2.

The assembled read head 62 is mounted to the slider assembly 66. The slider channel 66a of the slider assembly 66 rests on a slider rail 140 which is connected to a slider base 142. Slider rail 140 has a height "Rh" of about 0.650 inch, and a width "Rw" of about 0.125 inch, and slidably engages channel 66a to allow slider assembly 66 to move smoothly along the length of rail 140. Gravity holds slider assembly 66 in place on slider rail 140. Slider assembly 66 can be slid freely along slider rail 140 so that read head 62 can be precisely re-positioned longitudinally over the document 56 at any desired location. Arrow 64 shows the direction the read head 62 is slid along slider rail 140 during a flux measurement pursuant to the preferred embodiment of the inventive method, both for calibration of the read head 62 and for positioning to read a selected one of the characters 60.

Figure 9:
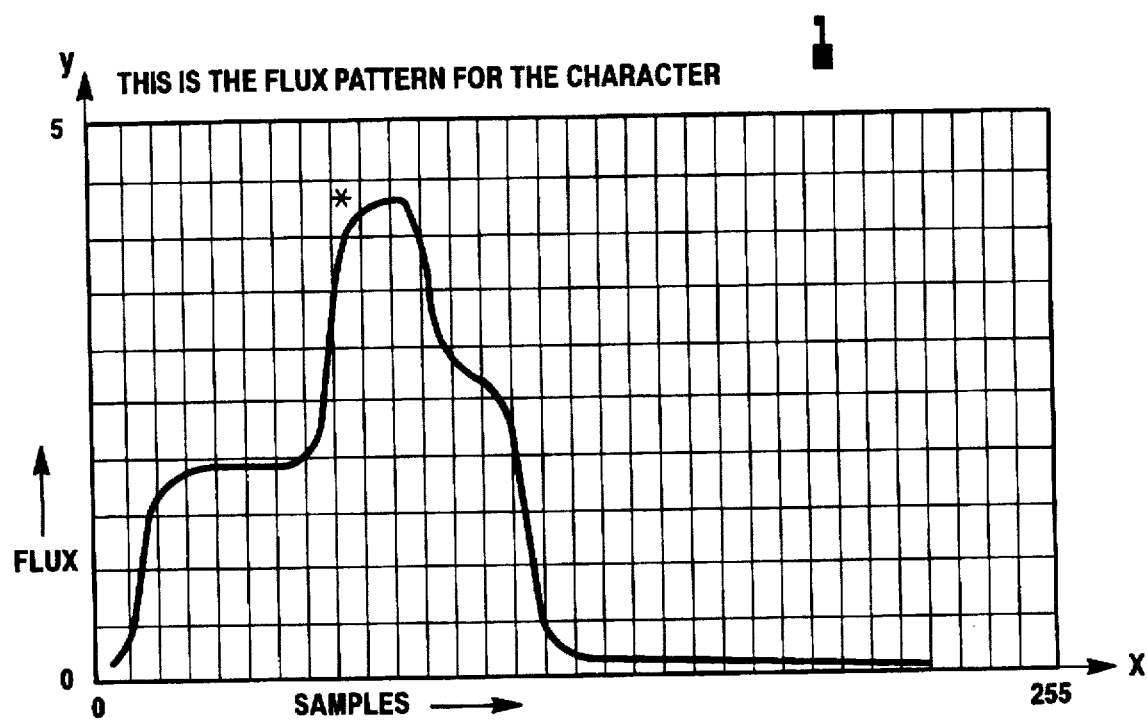
FIG. 9 through FIG. 22 are characteristic pattern diagrams that illustrate the flux waveforms for the associated ones of the E-13B character set.
Figure 10:
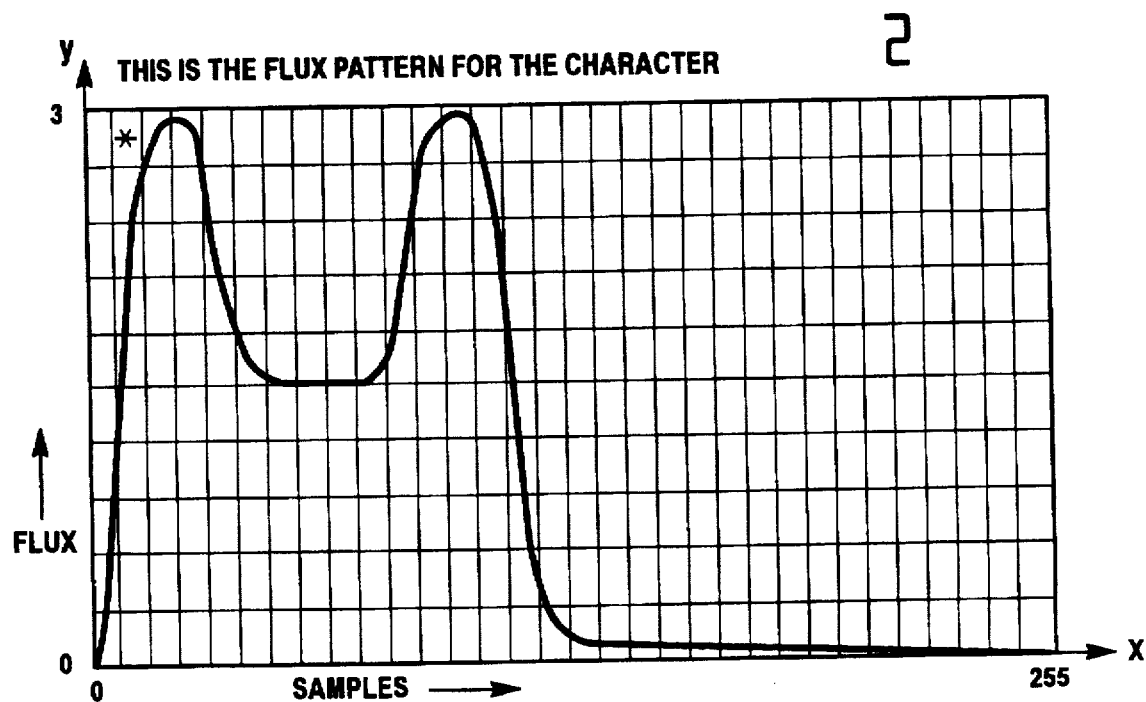
Figure 11:
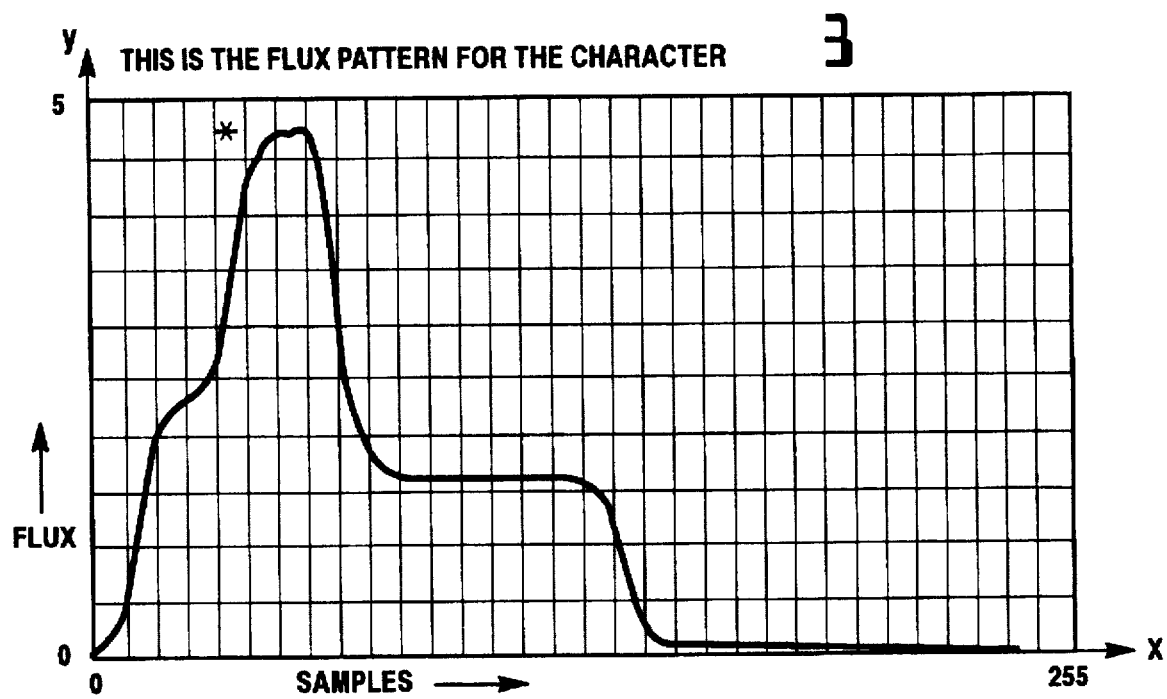
Figure 12:
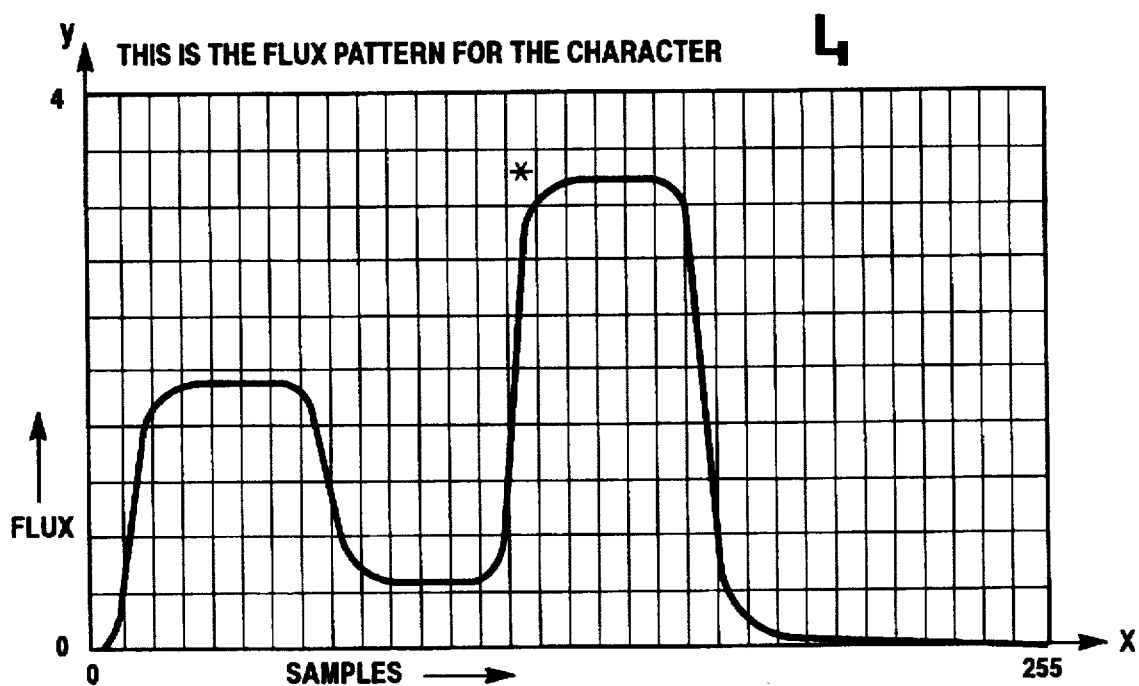
Figure 13:
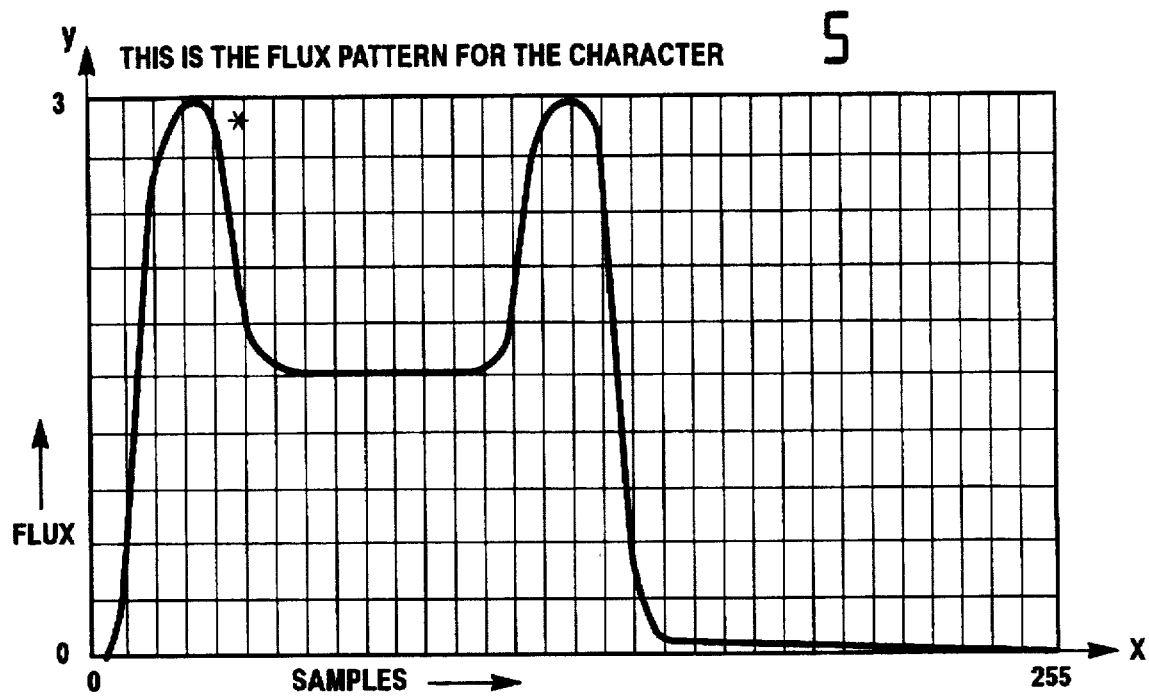
Figure 14:
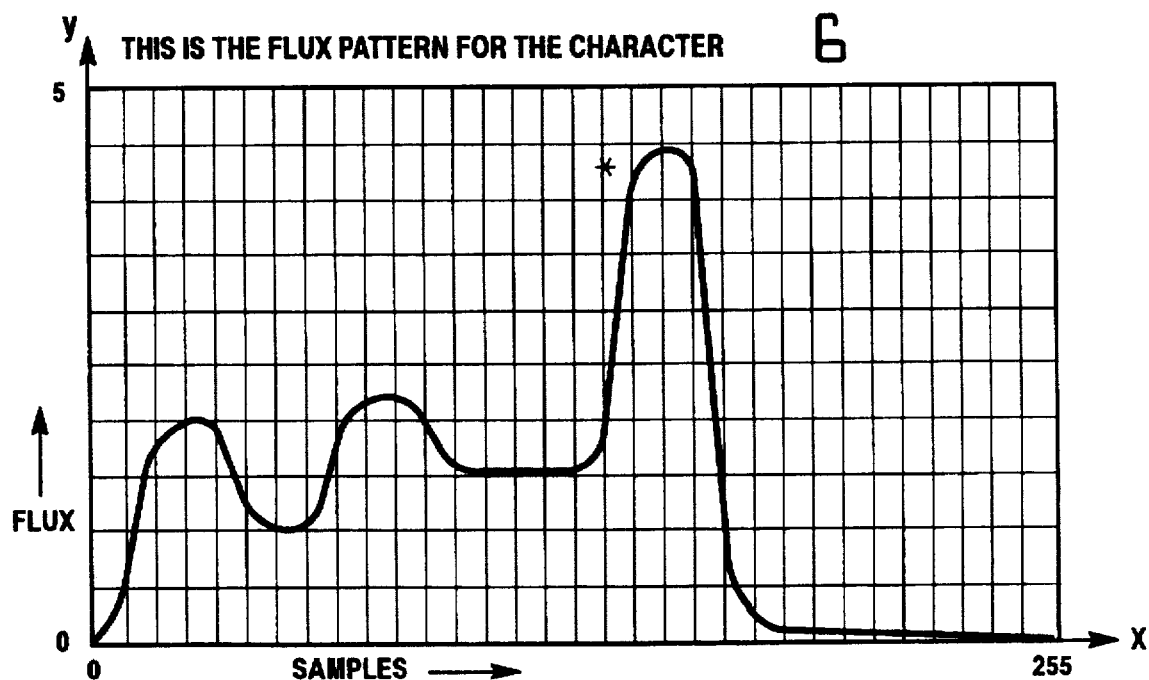
Figure 15:
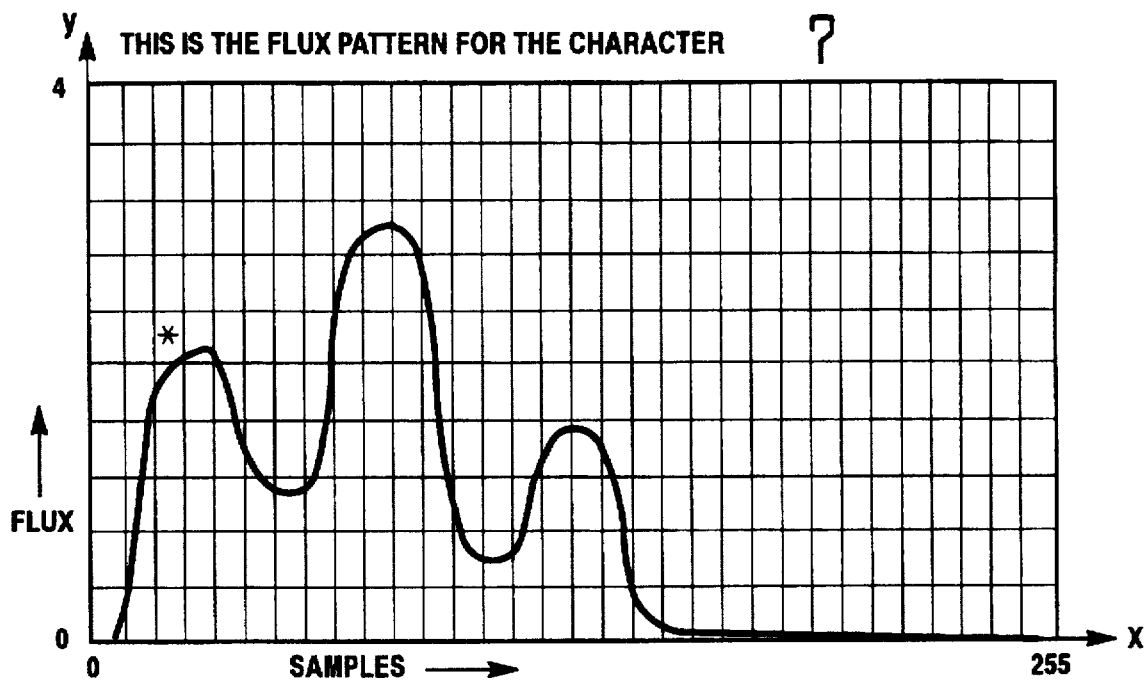
Figure 16:
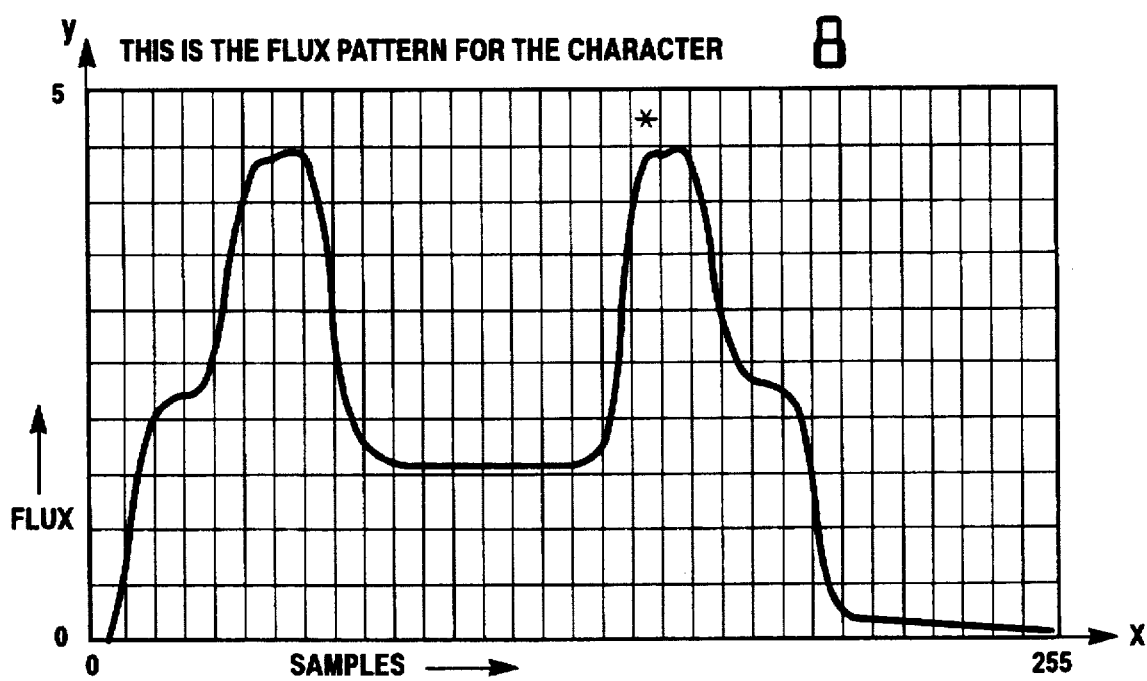
Figure 17:
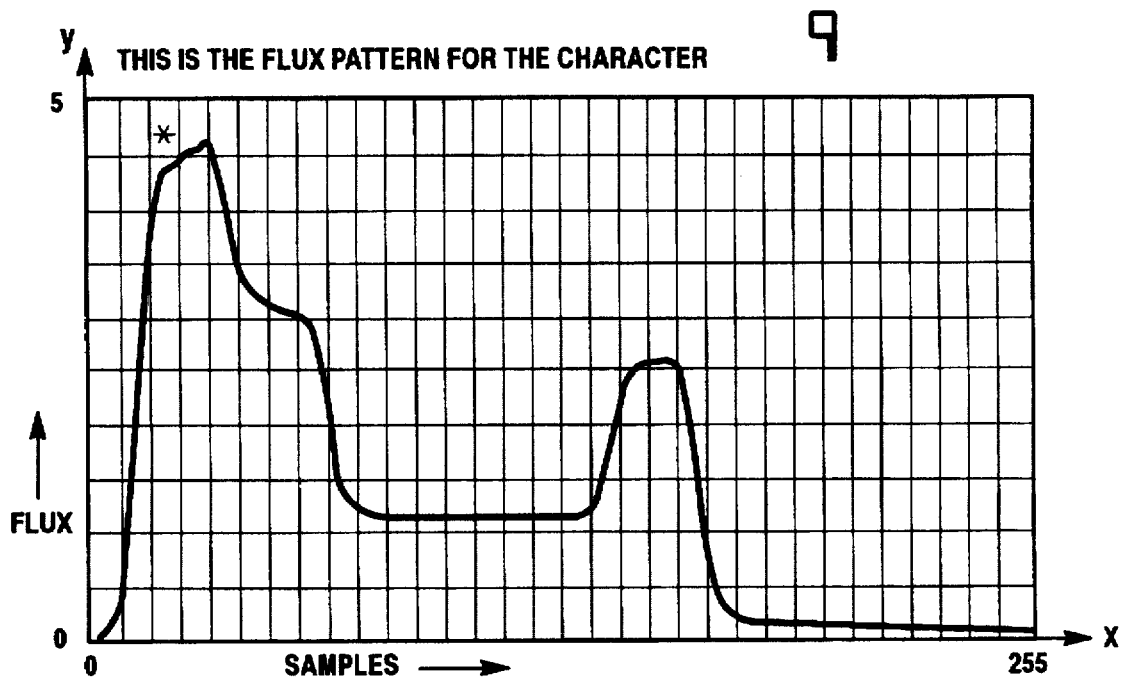
Figure 18:
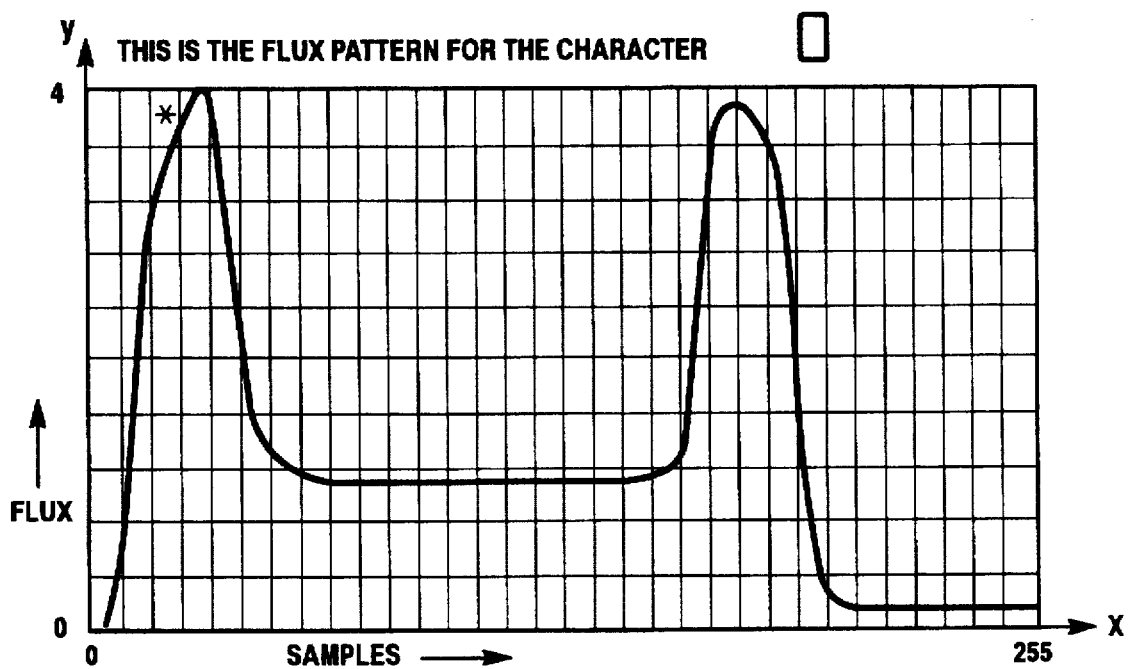
Figure 19:
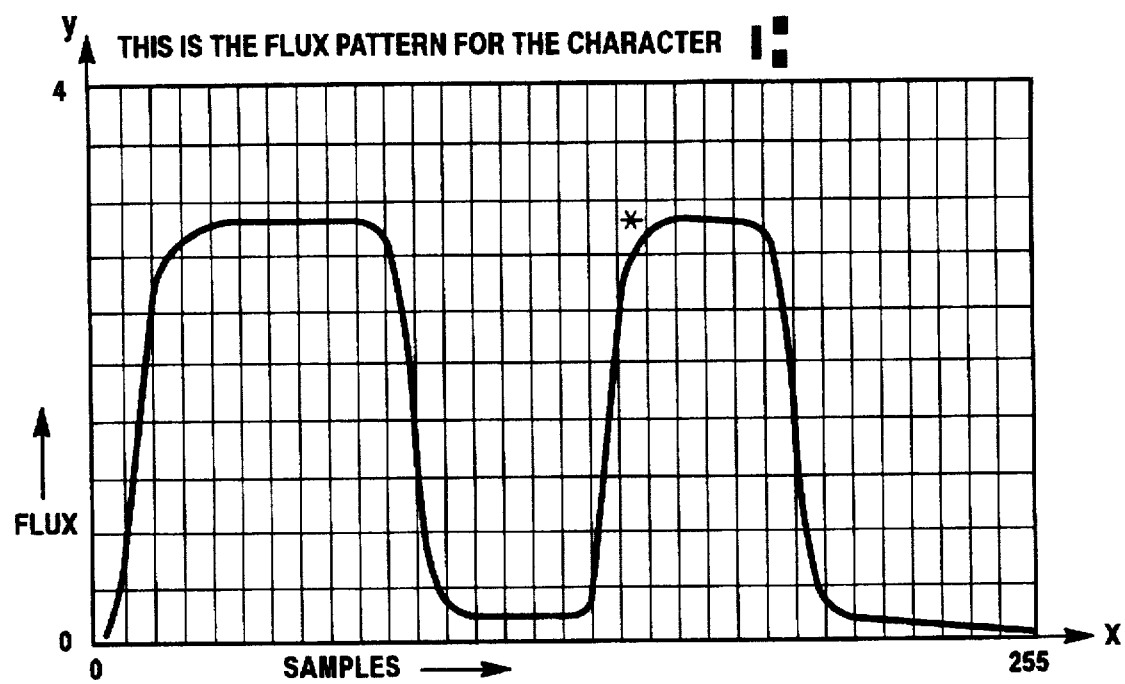

FIG. 9 through FIG. 22 are characteristic pattern diagrams that each illustrate the flux waveforms for the associated ones of the E-13B character set. These waveforms were calculated using an equation which takes into account the flux pattern generated by the respective E-13B character magnetized at 100% of nominal. However, these waveforms could also be obtained using a calibrated read head to measure magnetic flux as the read head is re-positioned in uniform increments at sample locations from right to left across the respective character printed at 100% of nominal. The x axis represents the sample number, which on FIG. 9 through FIG. 22 ranges from 0 to 255, with the first sample taken being sample "one", and so on for the incremental measurements taken. The magnetic flux is recorded on the y axis in arbitrary flux units chosen for convenience. Each unit roughly represents 0.024 gauss per unit. For example, the y axis on FIG. 9 is labeled from 0 to 5 arbitrary flux units, which represents from 0 to about 0.120 gauss. It may be noted that the waveforms included in the ANS 9.27 standard for the E-13B character set are the dφ/dt waveforms, and can be obtained by taking the derivatives of the FIG. 9 through FIG. 22 waveforms.

Figure 23A:
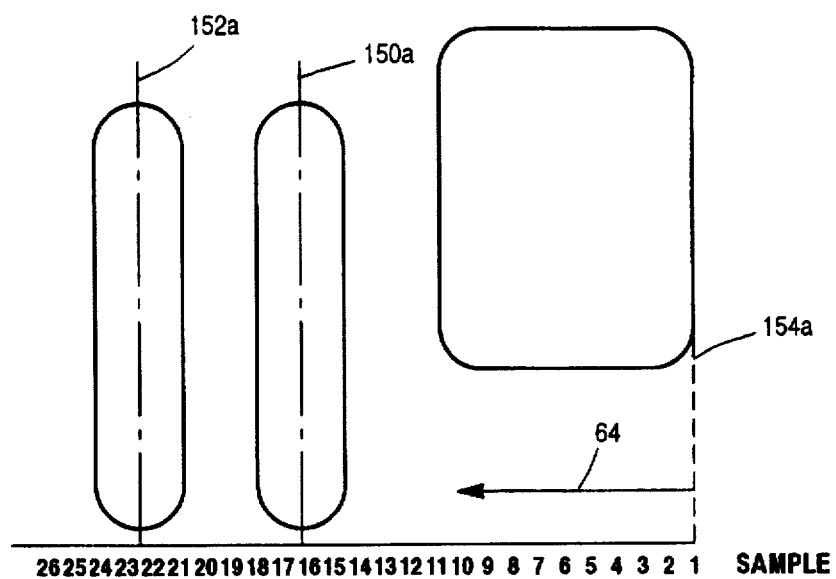
FIG. 23A is a diagram depicting a flux read head being moved from right-to-left across a printed E-13B "On-Us" character to obtain the characteristic pattern diagram of FIG. 23B.
Figure 23B:
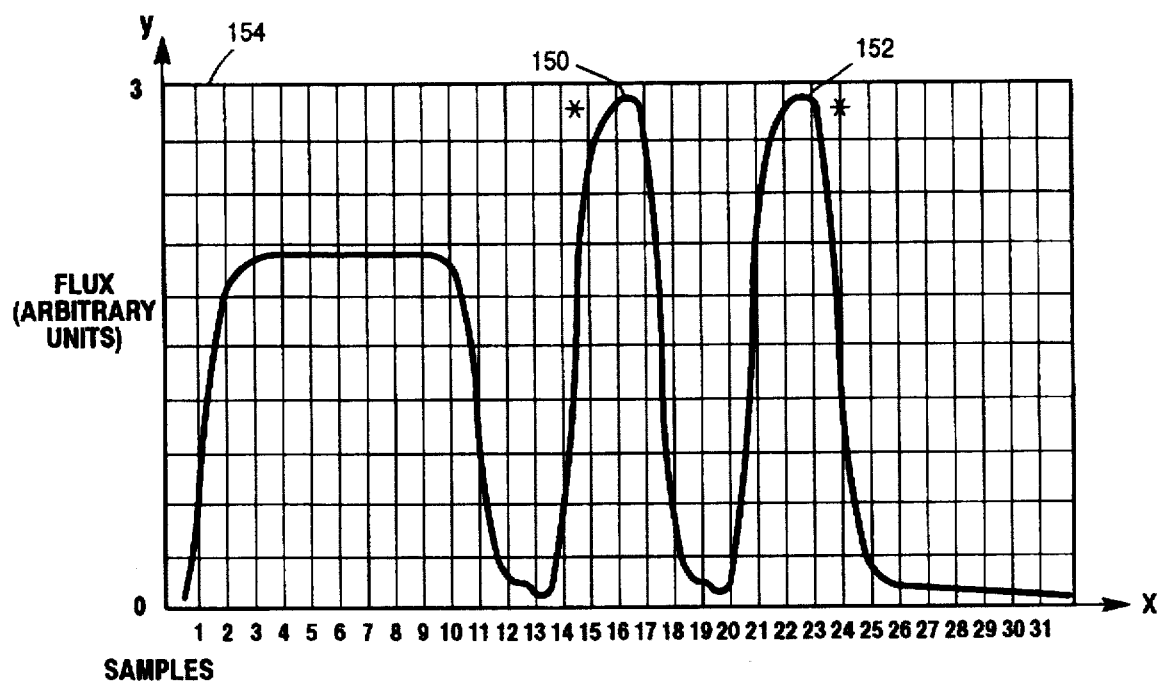
FIG. 23B is the characteristic pattern diagram for the "On-Us" character.

FIG. 23A is a diagram depicting a flux read head being moved from right-to-left across a printed E-13B "On-Us" character to obtain the characteristic pattern diagram of FIG. 23B. The On-Us character is being used for exemplary purposes since it is the symbol universally used for calibration purposes. The flux read head assembly 62 is first positioned over a reference edge 154a of the On-Us character. When the flux read head is positioned over reference edge 154a, the flux measured by the direct flux measurement device 44 of the read head assembly 62 corresponds to sample 1, 154, of FIG. 23B. As the flux read head is re-positioned at the various successive sample locations, as indicated by arrow 64, flux measurements are taken which correspond to the flux values at the various sample locations on the waveform of FIG. 23B. Locations 150a and 152a of the "On-Us" character correspond to "calibration locations", which are explained in more detail below. The flux measured at calibration location 150a of FIG. 23A corresponds to flux reading 150 of FIG. 23B. Likewise, the flux measured at calibration location 152a of FIG. 23A corresponds to flux reading 152 of FIG. 23B. For illustration purposes, twenty-six discrete samples were used to correlate FIG. 23A to FIG. 23B. To obtain the actual waveform of FIG. 23B, many more samples would be needed. Each of the figures depicted in FIG. 9 through FIG. 22 are related to the corresponding magnetic character in the same manner as outlined in FIG. 23A and FIG. 23B using the On-Us character as an example.

Figure 24A:
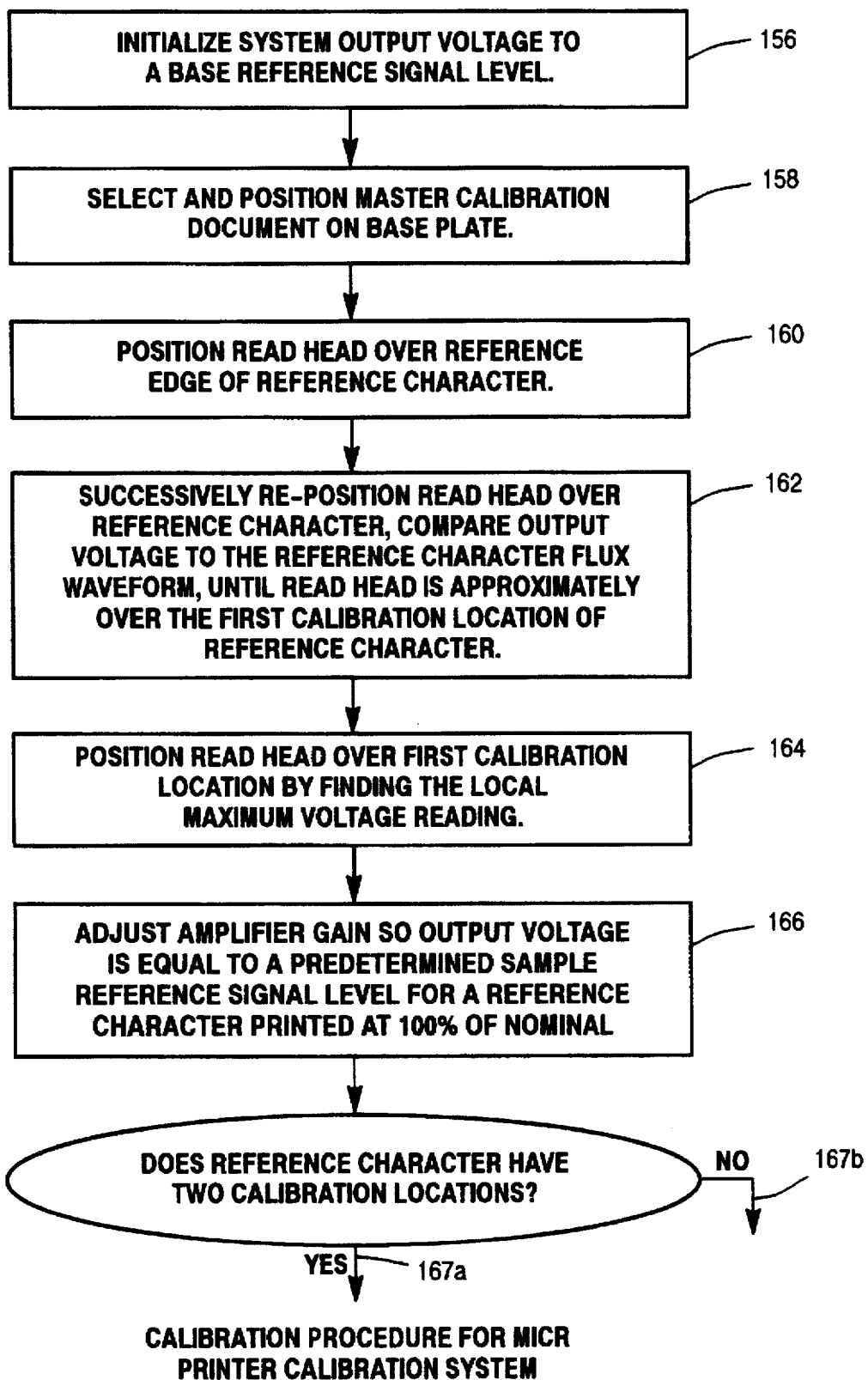
FIG. 24A and FIG. 24B together are a flowchart of the method used to calibrate the present invention.
Figure 24B:
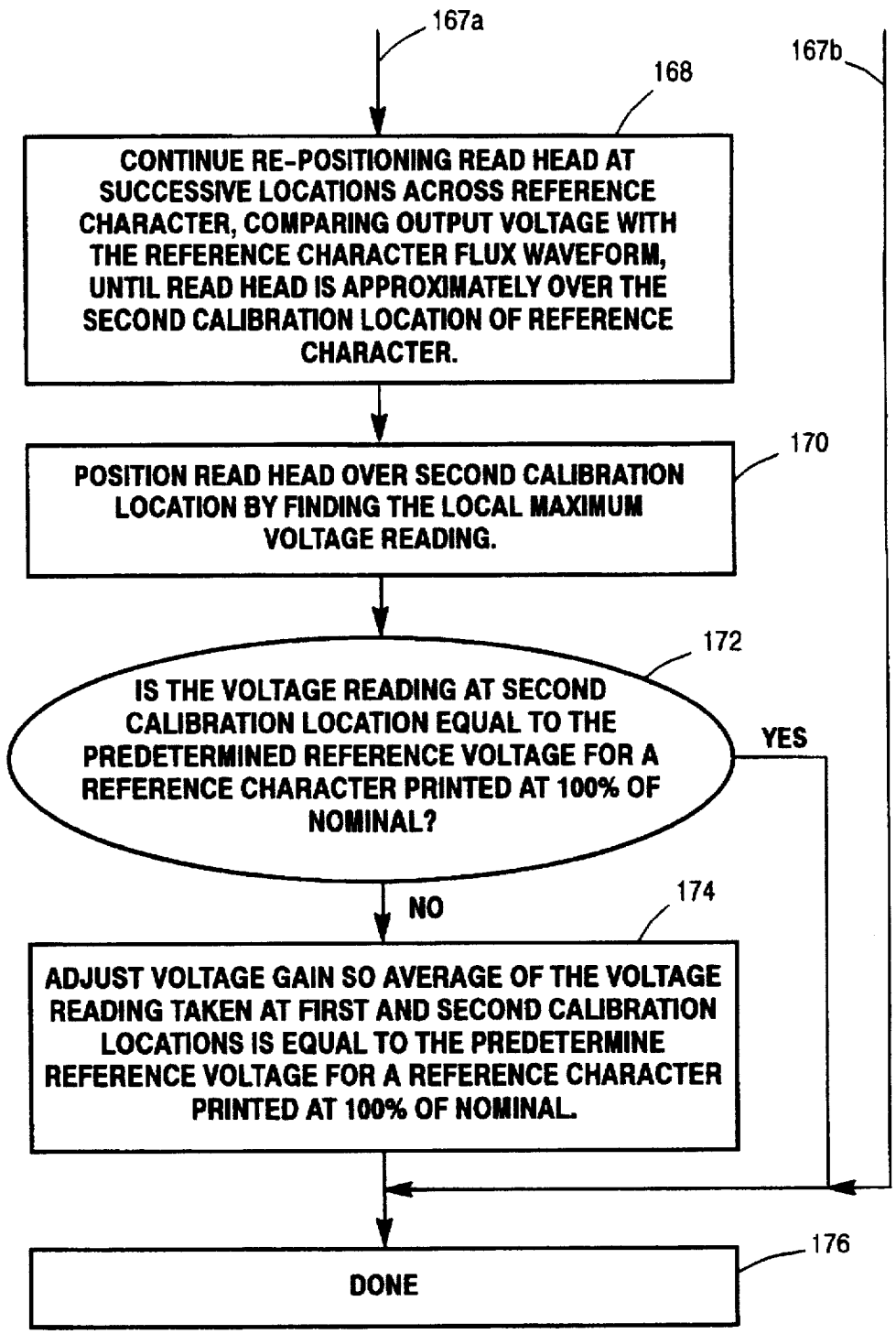

FIG. 24A and FIG. 24B together are a flowchart of the method used to calibrate the present invention. First, as shown in block 156, the user initializes the calibration system output voltage to a base reference voltage. Using the preferred embodiment of FIG. 7, this involves adjusting the potentiometer R3 100 so the output voltage at node 122 is zero when the read head assembly 62 is experiencing only the magnetic field of the earth. This adjustment assures that read head measurements are not partially reflecting the magnetic field of the earth or immediate surroundings. Anytime the flux read head assembly is re-located, step 156 must be repeated.

Next, as shown in block 158, the user positions a MICR master calibration document having magnetic characters imprinted thereon on the base plate 58. The document edge nearest the magnetic characters should be aligned against the lip 54 of the baseplate. Block 160 then specifies that the read head is repositioned over a reference edge of a reference character. In the preferred embodiment, the "On-Us" character of FIG. 23A is used as the reference character to calibrate the read head 62 apparatus since this character is universally used for calibration purposes. The reference edge of the On-Us character is the right edge 154a of FIG. 23A. The read head is positioned at various locations over the reference character by sliding the slider assembly 66 along the slider rail 140 until the first "calibration location" is found, as designated in block 162.

Every E-13B character has at least one "calibration location". This is a Location over which the read head can be positioned to measure a flux reading (or a corresponding voltage reading which can be used for calibration purposes. Flux measurements at calibration locations correspond the local maximums on the flux waveforms marked by asterisks ("*") in FIG. 9 through FIG. 23B.

The On-Us character of FIG. 23A can provide an example of how a calibration location is found. Since the voltage at node 122 of the amplifier circuit varies in direct proportion to the magnetic flux being directly measured as the read head 62 is successively re-positioned from right to left across the On-Us character, the user will note the voltage measurement rise in a manner directly proportional to the flux waveform of FIG. 23B. When the read head front gap spacer 28 is positioned over location 150a, which is the first calibration location, the flux being measured will correspond to the flux measurement at 150 on the flux waveform, which is 0.070 gauss for an On-Us character printed at 100% of nominal. The voltage at the calibration location will be a local maximum reading, so that if the read head front gap 28 is positioned slightly left or right of location 150a, the voltage will begin to decrease. Thus to more precisely locate the calibration location, the user adjusts the read head back and forth until the maximum voltage is obtained on the voltmeter, as indicated by FIG. 24A block 164.

Each of the approximate calibration locations for the associated E-13B character can be found, as described above, by comparing the voltage as measured by voltmeter 126 to the corresponding one of the flux waveforms of FIG. 9 through FIG. 22. The calibration location is found more precisely by obtaining the local maximum voltage reading. Some characters have two calibration locations. In these cases, the flux at the two locations will be approximately the same (as will be the associated voltages) for that reference character printed at 100% of nominal.

Next, as shown by FIG. 24A block 166, after the calibration location is found, the user adjusts the amplifier gain to obtain a predetermined sample reference signal level for that reference character printed at 100% of nominal. In the preferred embodiment, the user accomplishes this adjustment by adjusting potentiometer R9 120 so that the voltage read by voltmeter 126 is 1.000 volt for a reference On-Us character printed at 100% of nominal. If the master calibration document were printed at 98% of nominal, the potentiometer should be adjusted to obtain a voltage reading of 0.980 volts.

Next, arrow 167b indicates that if a second calibration location does not exist for the chosen reference character, as indicated by the absence of a second asterisk on the associated waveform, the user has completed calibrating the read head system. If a second calibration location does exist, however, as shown by arrow 167a, the user re-positions the read head approximately over the second calibration location, as shown in block 168. The second calibration location is more precisely found, as shown in block 170, by adjusting the read head back and forth over the approximate position of the second calibration location until the maximum voltage is obtained on the voltmeter 126. The voltage at the second calibration location should be approximately the same voltage obtained at the first calibration location. If this is the case, no further amplifier adjustment is necessary, as shown in block 176. If, however, the voltages measured at the first and second calibration locations are different, the voltage gain of the amplifier must be re-adjusted so the average of the voltages measured at the first and second calibration locations is equal to a predetermined reference voltage, as shown in block 174.

Figure 21:
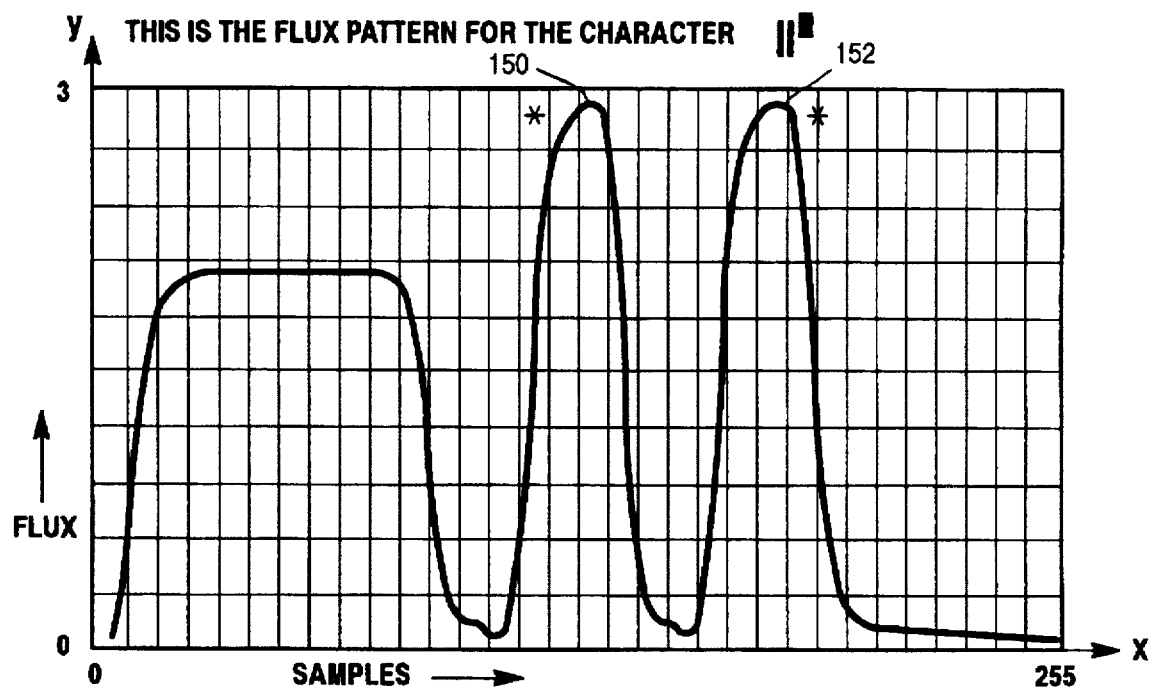
Figure 22:
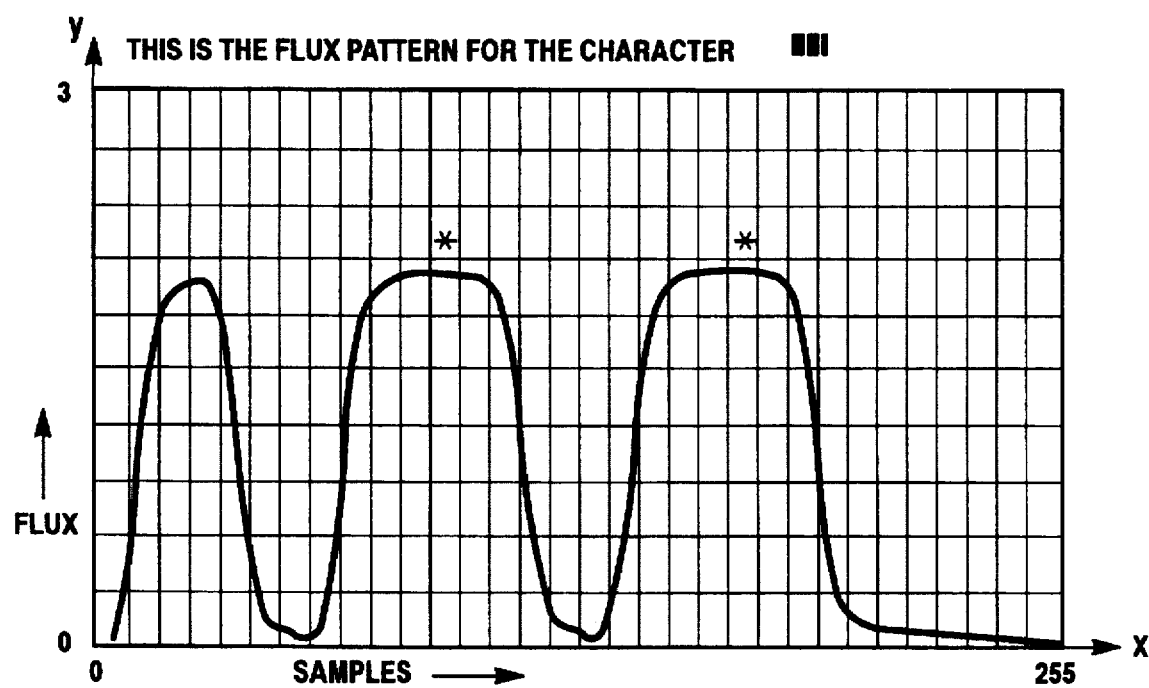

In the preferred embodiment, the second calibration location is 152a of FIG. 23A, which corresponds to the local maximum flux value 152 of FIG. 21 and FIG. 23B. After performing the amplifier gain adjustment shown in block 174, the voltage measurement at second calibration location 152a should be 1.000 volt for a reference On-Us character printed at 100% of nominal. If this is not the case, the potentiometer R9 120 must be adjusted to obtain a 1.000 volt average for the measurements made at locations 150a and 152a for an On-Us character printed at 100% of nominal. Again, it should be noted that the average of the voltages at locations 150a and 152a should match the calibration value as indicated on the master calibration document. For example, if the master calibration document is printed at 98% of nominal, the amplifier should be adjusted to measure an average of 0.980 volt. The read head is now calibrated and can be used to calibrate a MICR printer.

Figure 25A:
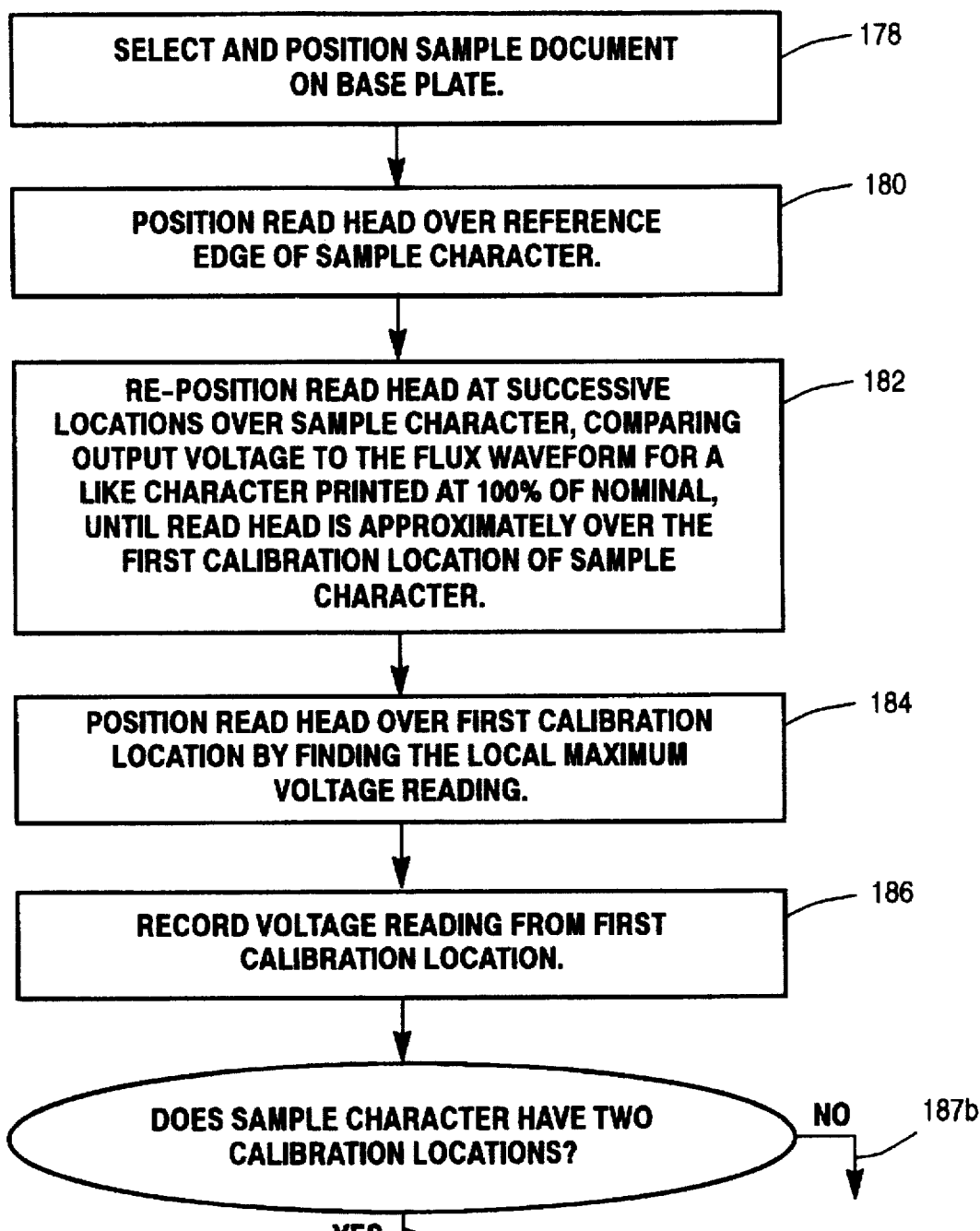
FIG. 25A and FIG. 25B together are a flowchart of the inventive method for measuring the magnetic signal level of a printed MICR character so that the printing process can be adjusted if the measurement is outside of a given tolerance range.
Figure 25B:
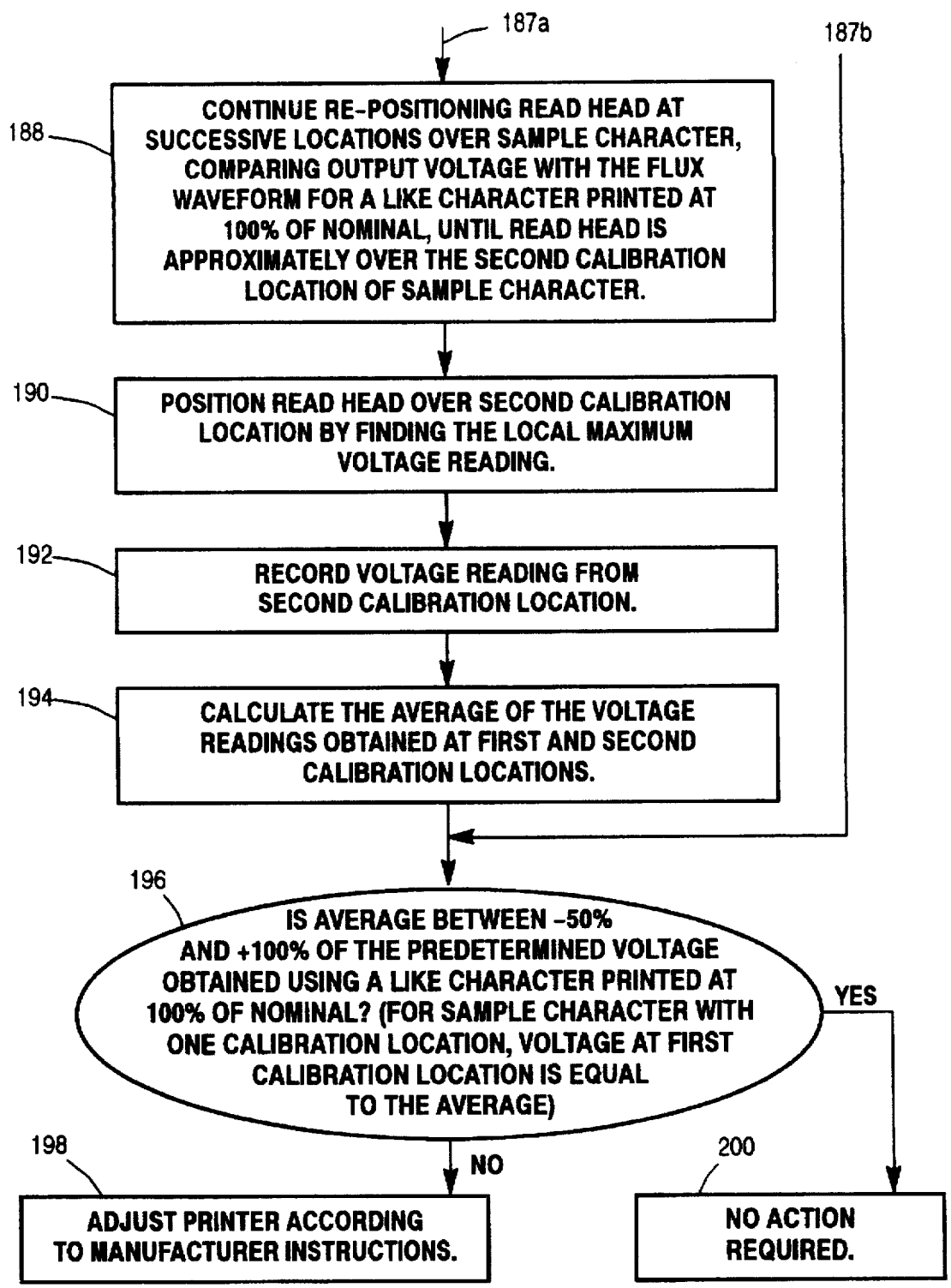

FIG. 25A and FIG. 25B together are a flowchart of the inventive method for measuring the magnetic signal level of a printed MICR character so that the printing process can be adjusted if the measurement is outside of a given tolerance range. As shown in block 178, a sample document having magnetic characters printed thereon by a target printer to be calibrated is selected and placed on the base plate 58. The read head assembly 62 is positioned over the reference edge of the sample character, as described in block 180. In the preferred embodiment, the read head assembly 62 is positioned over the right edge 154a of the On-Us character imprinted on the selected document. Next, the user slowly re-positions the read head at successive locations over the sample character. In the preferred embodiment, the read head is re-positioned successively from right to left, as indicated by arrow 64. The first calibration location is located by comparing the flux waveform for the associated sample character to the voltmeter reading obtained from the sample character, as in block 182. For the preferred embodiment, the flux waveform for the On-Us character as shown in FIG. 21 and FIG. 23B is compared to the voltmeter measurement obtained from node 122 to locate the approximate location of the first calibration location 150a. The first calibration location is more precisely located by moving the read head over the approximate location until the maximum voltage reading is obtained on the voltmeter 126, as shown in block 184. The user records this voltage, as in block 186.

If a second calibration location exits for the sample character, as indicated by the asterisks (*) on the associated one of the flux waveforms, the measurement process is repeated as indicated by arrow 187a. The user continues moving the read head over the sample character until the second calibration location is found, as indicated by block 188. The second calibration location is more precisely located by finding the local maximum voltage reading, as specified in block 190. In the preferred embodiment, a second calibration location exists for the On-Us character. Therefore, the read head assembly 62 is scanned left over the On-Us character until second calibration location 152a is located. The user records the voltage reading at the second calibration location, as shown in block 192. The average of the voltages recorded from the first and second calibration locations is calculated, as in block 194.

Next, the user compares the voltage measured from the sample character to the voltage measurement obtained using a like character printed at 100% of nominal, as shown in decisional block 196. If the sample character had only one calibration location, the single voltage measurement taken at the first calibration location is used for comparison purposes, as indicated by arrow 187b and decisional block 196. If the sample character has two calibration locations, the average voltage as calculated in block 194 is used instead. The voltages obtained for associated ones of the E-13B character set printed at 100% of nominal, and measured on a read head system calibrated using a 100% nominal On-Us character, are shown in column four of FIG. 26, as discussed further below. If the measured voltage from the sample character is within −50% and +100% of the 100% nominal voltage reading, as listed in columns five and six of FIG. 26, respectively, no printer adjustment is needed, as indicated in block 200. Otherwise, the user must adjust the printer according to manufacturer specifications, as shown in block 198.

In the preferred embodiment, the average of the voltages measured at the first calibration location 150a and the second calibration location 152a for the On-Us character printed on a sample document should be within −50% and +100% of the 1.000 volt reference voltage used during the calibration procedure of FIG. 24A and FIG. 24B. Therefore, the voltage measured from the sample On-Us character should be between 0.500 volt and 2.000 volts. If the voltage measured from the sample character is outside of this range, the MICR printer must be adjusted.

The preferred embodiment of the FIG. 25A and FIG. 25B inventive procedure uses the "On-Us" character, since this character is universally used for calibration purposes. As mentioned above, however, once the read head has been calibrated using the On-Us character as described in FIG. 24A and FIG. 24B, any MICR character can be used in the measurement procedure of FIG. 25A and FIG. 25B, as exemplified below.

FIG. 26 is a table listing acceptable ranges for voltage readings obtained using a properly calibrated embodiment of the current invention positioned over the proper calibration positions for the respective E13-B characters. Column one of the table contains the MICR character name. Column two identifies local maximum points on the flux waveforms. These points correspond to the calibration locations marked with asterisks in the waveforms of FIG. 9 through FIG. 22. Column three lists the flux measurements obtained at the calibration locations for characters printed at 100% of nominal. These flux measurements are described in arbitrary flux signal units. An arbitrary flux signal unit is defined so that the average of the flux measurements at calibration locations 150a and 152a for the On-Us character is set to 100 arbitrary flux units. It may be noted that these arbitrary signal units are different from those chosen to describe flux units on the Y-axes of FIG. 9 through FIG. 22. Column four lists the voltages obtained at node 122 of the amplifier circuit of FIG. 7 when the read head 62 is positioned over the calibration location(s) for the respective character printed at 100% of nominal if the amplifier gain is adjusted so 100 arbitrary flux signal units is amplified to 1.000 volt. Columns five and six list the lower and upper voltage limits, respectively, which will be produced by MICR characters printed within the acceptable tolerance range of −50% and +100% as dictated by the ANS 9.27 specification.

Figure 20:
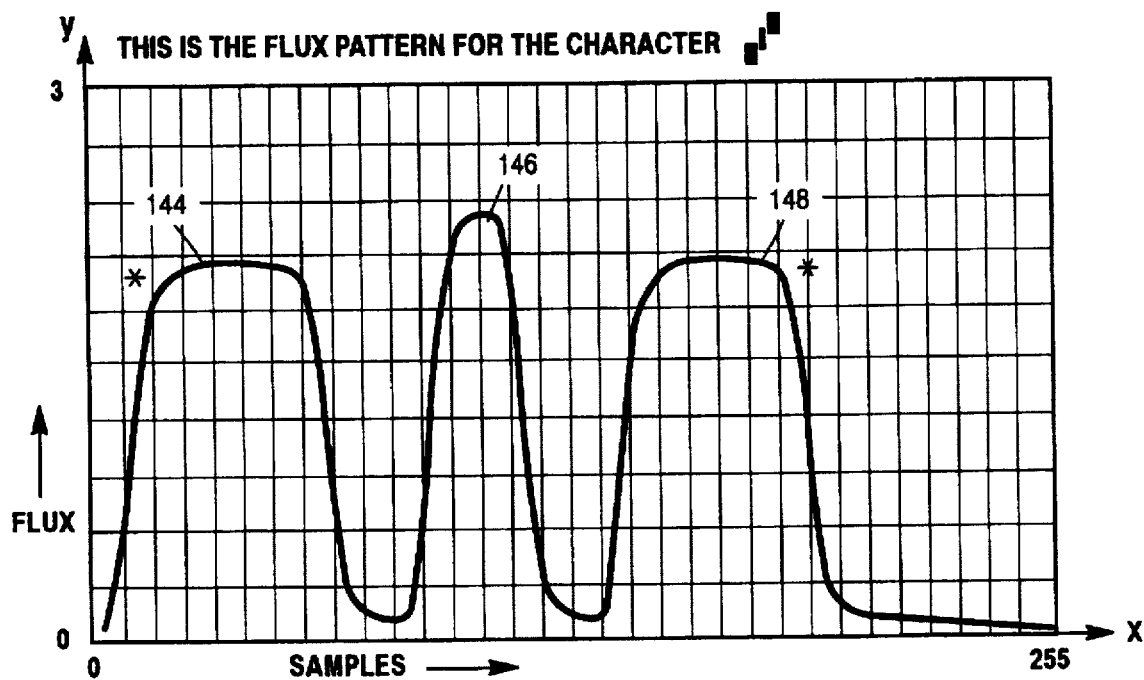

FIG. 26 can be furthered explained using the "Amount" 202 symbol as an example. FIG. 20 shows the flux waveform for the Amount symbol. Two asterisks mark the two peaks 144 and 148 FIG. 20 which correspond to the calibration locations. The peaks 144 and 148 can also be referred to as peaks "one" and "three", respectively, since three localized maximums 144, 146, and 148 exist on this waveform. This peak designation is echoed in column two row 202 of FIG. 26. The column two data indicates that for the Amount symbol, voltage measurements must be taken at two calibration locations corresponding to peaks "one" and "three" (144 and 148 respectively), then an average calculated. As indicated in column four, this average for a 100% nominal Amount signal will be 0.700 volt if read on a MICR read system calibrated to give a 1.000-volt reading for a 100% nominal On-Us signal, or stated another way, for 100 arbitrary flux units. Columns five and six provide the voltages which would be measured for Amount characters printed at −50% and +100% of nominal, respectively. If the measured voltage is within this range, no printer adjustment need be performed.

The data of FIG. 26 was scaled so that the flux produced by a 100% nominal On-Us character is set to 100 arbitrary flux units. As mentioned above, the On-Us character was made the reference character because it is universally accepted for this purpose. However, the FIG. 26 data could be re-scaled so that a different character is chosen as a reference. For example, the flux produced at the calibration locations of a 100% nominal "Amount" symbol could be set to 100 arbitrary flux units, and the read head re-calibrated to read 1.000-volt for these 100 units. While this would change the data of FIG. 26, the procedures described in FIG. 24A and FIG. 24B, and FIG. 25A and FIG. 25B, would remain the same. Moreover, although the procedures are described in terms of the E13-B character set, they are equally applicable when measuring the magnetism for any magnetic ink characters.

The above-described read head system provides a very inexpensive method for reading the signal levels of characters printed by MICR printers, costing on the order of hundreds of dollars, versus thousands of dollars for a system which performs the calibration using dφ/dt measurements. Moreover, the system is both portable, and easy-to-use.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. For use with a magnetic ink character recognition printer that applies magnetic ink symbols, including predetermined magnetic ink characters, to a substrate, a method for monitoring the quality of the application of magnetic ink, comprising:

placing a direct flux measurement device within the magnetic field of a predetermined sample character printed in magnetic ink by the magnetic ink character recognition printer;

positioning said direct flux measurement device to a predetermined calibration location for said predetermined sample character;

measuring the directly sampled flux at said predetermined calibration location using said direct flux measurement device;

comparing said sampled flux with the flux expected to be encountered at a similar calibration location of a like master character printed at a predetermined flux level indicative of satisfactory magnetic ink printing to thereby determine if the flux level of said sample character is within a predetermined tolerance range established with relationship to said predetermined flux level of said like master character.

2. The method of claim 1, further comprising:

adjusting the magnetic ink character recognition printer when said comparing step indicates that the predetermined sample character not within said predetermined tolerance range.

3. The method of claim 1 further comprising:

generating an electrical signal which is representative of the magnetic flux as measured by said direct flux measurement device.

4. The method of claim 3, and further comprising:

calibrating said direct flux measurement device to provide a predetermined reference signal level when placed in a non-sampling position.

5. The method of claim 4, wherein said step of calibrating includes the steps of:

positioning said direct flux measurement device in a location to be subject only to the naturally occurring magnetic flux of the earth; and adjusting said direct flux measurement device to provide a desired base reference signal level.

6. The method of claim 5 wherein said step of calibrating further includes the steps of:

positioning said direct flux measurement device in a predetermined calibration location relationship with respect to a predetermined reference character having the same size and shape characteristics of said sample character and printed with magnetizable ink and having a predetermined magnetic flux level; and further adjusting said direct flux measurement device to provide a sample reference signal level in response to direct reading of said predetermined magnetic flux level produced by said reference character.

7. The method of claim 3, wherein said positioning step comprises:

providing a master flux waveform for said sample character indicative of a series of master flux values derived for the magnetic flux at incremental positions for a like master character, said master flux values being proportional to said electrical signals generated by said direct flux measurement device positioned at corresponding incremental positions on said like master character;

moving said direct flux measurement device in incremental positions along a line corresponding to the approximate direction of the vector of magnetism which lies in the plane of said sample character;

observing values of said electrical signals at various ones of said incremental positions for said sample character;

comparing the observations of said electrical signals with said master flux values of said master flux waveform;

adjusting the position of said direct flux measurement device along said line of said vector of magnetism until said value of said electrical signal corresponds to a predetermined one of said master flux values indicative of said predetermined calibration location.

8. The method of claim 7 wherein said predetermined calibration location corresponds to a local maximum flux value on the master flux waveform for said sample character.

9. The method of claim 3, wherein said step of comparing further comprises comparing said electrical signal measured at said predetermined calibration location of said predetermined sample character with an electrical signal measured at said calibration location of said like master character printed at a predetermined flux level.

10. For use in monitoring the application of magnetic ink characters to a substrate, and for determining whether adjustments to the application are needed to bring the magnetism associated with the characters within an acceptable predetermined tolerance range, a magnetic ink character printer calibration system, comprising:

magnetic flux read head means for sensing and concentrating magnetic flux;

direct flux measurement means mounted in said magnetic flux read head means, and for directly measuring the magnetic flux of a sample magnetic ink character printed by the magnetic ink character printer to be calibrated and for providing an electrical signal representative of the level of said magnetic flux;

metering means for measuring said electrical signal for said sample magnetic ink character for use in conjunction with comparison signal data for a master character for use in determining whether said electrical signal for said sample character is within an acceptable predetermined tolerance range of said comparison signal data.

11. The calibration system of claim 10, wherein said direct flux measurement means is a Hall-Effect means having output terminal means, said Hall-Effect means for converting a direct flux measurement into a voltage signal representative of said flux measurement at said output terminal means.

12. The calibration system of claim 10, wherein said direct flux measurement means employs Giant Magnetoresistive Ratio materials for converting a direct flux measurement into a voltage signal representative of said flux measurement.

13. The calibration system as in claim 10, and further including signal amplifier means coupled to said direct flux measurement means for amplifying said electrical signal representative of said magnetic flux.

14. The calibration system of claim 13, wherein said magnetic flux read head means includes:
   a first pole piece means formed of a ferromagnetic material having a high magnetic permeability and low coercive force for capturing and concentrating flux;
   a second pole piece means formed of a ferromagnetic material having a high magnetic permeability and low coercive force, and positioned in close proximity to said first pole piece means, for capturing and concentrating flux;
   a back gap spacer means formed of non-ferromagnetic material and interposed between said first pole piece means and said second pole piece means within said back gap for creating a break in the magnetic circuit formed by said first pole piece means and said second pole piece means;
   a front gap spacer means formed of non-ferromagnetic material and interposed between said first pole piece means and said second pole piece means within said front gap for creating a break in said magnetic circuit formed by said first pole piece means and said second pole piece means, and for use in directly sensing magnetic flux emitted by said sample magnetic ink character;
   said Hall-Effect means positioned within said back gap for measuring the flux encountered at said front gap and concentrated through said first pole piece means and said second pole piece means to said back gap.

15. The calibration system of claim 14 wherein said amplifier means includes:
   first amplifier means having a first and second input terminal means and an output terminal means, said first input terminal means of said first amplifier means being coupled to said output terminal means of said Hall-Effect means for providing an amplified electrical signal of said electrical signal produced by said Hall-Effect means;
   variable voltage divider means coupled to said second input terminal means of said first amplifier means for adjusting the output voltage of said first amplifier means to a base reference signal level when said Hall-Effect means is subject only to the naturally occurring magnetic flux of the earth;
   second amplifier means having a first and second input terminal means and an output terminal means, said first input terminal means of said second amplifier means being coupled to said output terminal means of said first amplifier means, and said second input terminal means of said second amplifier means being coupled to a predetermined voltage level, for amplifying said amplified electrical signal provided by said first amplifier means.

16. The calibration system of claim 15 wherein said amplifier means further includes a variable gain adjustment means for varying the gain of said amplifier means so that said amplifier means provides a predetermined electrical signal when said magnetic flux read head means is positioned over a predetermined calibration location of said master magnetic ink reference character printed at a predetermined flux level.

17. The calibration system of claim 14 wherein said flux read head means is mounted to an assembly for guiding read head motion, comprising:
   movable support means having a slider channel and mounted to said magnetic flux read head means for holding said magnetic flux read head means within the vicinity of said magnetic ink characters, and for adjusting the position of said magnetic flux read head means to a new position within the field of magnetism of said sample magnetic ink character;
   guide means which slidably engages said slider channel for guiding the motion of said movable support means along a line corresponding approximately to the vector of magnetism lying in the plane of said magnetic ink character; and
   base plate means for supporting documents containing magnetic ink characters in a predetermined physical position relative to said guide means.

18. For use in monitoring the quality of the application of magnetic ink to a substrate by directly measuring the magnetic flux of a predetermined sample magnetic ink character at a predetermined calibration location for comparison with predetermined master data representing the flux produced by a like master calibration magnetic ink character printed at a predetermined flux level and measured at a like predetermined calibration location so that the application process can be adjusted if the magnetic flux of the predetermined sample magnetic ink character is not within a predetermined tolerance range of the predetermined master data, a calibration system, comprising:
   read head means for capturing and directing the magnetic flux produced by a sample magnetic ink character;
   magnetic flux reading means coupled to said read head means for directly measuring said magnetic flux, and for providing an electrical signal representative of said magnetic flux;
   amplifying means for amplifying said electrical signal to a level which is easily measurable by a common metering device;
   measuring means for measuring said amplified electrical signal; and
   positioning means mounted to said read head means for positioning said read head means at the predetermined calibration location within the magnetic field of the predetermined sample magnetic ink character by comparing said amplified electrical signal to the predetermined master data to determine direction of motion.

19. For use in monitoring the quality of the application of magnetic ink characters to a document by directly measuring the magnetic flux produced by sample magnetic ink characters at predetermined calibration locations so that the direct flux measurements can be compared to reference data representing the magnetic flux measured at like calibration locations from like master calibration magnetic ink characters printed at a predetermined flux level, a magnetic flux read head system, comprising:
   a first pole piece formed of a ferromagnetic material having a high magnetic permeability and low coercive force, and having a first mounting mating surface, a first back gap mating surface at a predetermined angle to said first mounting mating surface, a device mating contact portion positioned on said first back gap mating surface, a first front gap mating surface at a predetermined angle to said first mounting mating surface, and an arcuate base contact surface, wherein said arcuate base contact surface can be positioned over the document containing the sample magnetic ink characters, and wherein said first pole piece captures and concentrates the magnetic flux produced by the sample magnetic ink characters;

a front gap spacer formed of non-ferromagnetic material, and having a second front gap mating surface and a third front gap mating surface, with said second front gap mating surface mating with said first front gap mating surface;

a back gap spacer formed of non-ferromagnetic material, and having a second back gap mating surface mating with said first back gap mating surface, said second back gap mating surface further having a device receiving portion, and said back gap spacer further having a third back gap mating surface;

a second pole piece formed of a ferromagnetic material having a high magnetic permeability and low coercive force, and having a spacer mating surface for mating with said third front gap mating surface and said third back gap mating surface, and further having an arcuate base contact surface wherein said base contact surface can be positioned over the document containing the sample magnetic ink characters wherein said second pole piece captures and concentrates the magnetic flux produced by the sample magnetic ink characters; and a direct flux measuring device affixed within said device receiving portion and positioned so said direct flux measuring device is in juxtaposition with said device mating contact portion, said direct flux measuring device having a signal output terminal, wherein said direct flux measuring device measures the magnetic flux captured and concentrated by said first pole piece and said second pole piece and converts the flux measurement to an electrical signal provided to said signal output terminal.

20. The magnetic flux read head system of claim 19, further including an adjustable signal amplifier coupled to said signal output terminal, whereby said electrical signal is amplified to a predetermined adjustable level.

21. The magnetic flux read head system of claim 20, wherein said adjustable signal amplifier includes:

a first operational amplifier having a first input terminal, a second input terminal, and a first output terminal, said first input terminal being coupled to said signal output terminal of said direct flux measuring device, wherein said first operational amplifier amplifies said electrical signal and provides an amplified electrical signal; and a second operational amplifier having a third input terminal, and an amplifier output terminal, said third input terminal being coupled to said first output terminal, wherein said second operational amplifier amplifies said amplified electrical signal, and wherein said amplifier output terminal provides a re-amplified electrical signal.

22. The magnetic flux read head system of claim 21, wherein said adjustable signal amplifier further includes a variable voltage divider coupled to said second input terminal of said first operational amplifier, wherein said variable voltage divider can be adjusted so that a base reference signal level is provided at said amplifier output terminal when said direct flux measuring device is subject only to the naturally occurring magnetic flux of the earth.

23. The magnetic flux read head system of claim 20, and further including a metering device coupled to said adjustable signal amplifier.

24. The magnetic flux read head system of claim 21, wherein said amplifier further includes a variable resistor having a first resistor terminal and a second resistor terminal, said first resistor terminal being coupled to the third input terminal of said second operational amplifier, and said second resistor terminal being coupled to said amplifier output terminal, wherein said variable resistor allows the amplifier gain to be adjusted so that said amplifier output terminal provides a predetermined electrical signal when said front gap spacer is positioned over the predetermined calibration location of a predetermined one of the master calibration magnetic ink characters printed at a predetermined flux level.

25. The magnetic flux read head system of claim 20, and further including a support member having a second mounting mating surface coupled to said first mounting mating surface, said support member further having a positioning mechanism.

26. The magnetic flux read head system of claim 25, and further including a base structure comprising:

a slider base member having a first plate mounting mating surface, said slider base member further having a support surface, said support surface having a slider rail extending normally and running longitudinally along a portion of said support surface, wherein said slider rail slidably engages said positioning mechanism so said support member can be positioned at any location along said slider rail, thereby allowing re-positioning of said front gap spacer over any precise location over the sample magnetic ink characters printed on a document; and a base plate having a receiving surface, a longitudinal positioning lip, and a second plate mounting mating surface couple to said first plate mounting mating surface, wherein said receiving surface can receive a document having the sample magnetic ink characters printed thereon, and wherein the document is positioned in a predetermined orientation with respect to said longitudinal positioning lip.

* * * * *